(12) United States Patent
Bae

(10) Patent No.: US 9,972,720 B2
(45) Date of Patent: May 15, 2018

(54) SEMICONDUCTOR DEVICE HAVING A PLANAR INSULATING LAYER

(71) Applicant: SAMSUNG ELECTRONICS CO., LTD., Suwon-si, Gyeonggi-do (KR)

(72) Inventor: Dong Il Bae, Incheon (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/252,040

(22) Filed: Aug. 30, 2016

(65) Prior Publication Data

US 2017/0179299 A1 Jun. 22, 2017

(30) Foreign Application Priority Data

Dec. 16, 2015 (KR) ........................ 10-2015-0179992

(51) Int. Cl.
| | | |
|---|---|---|
| *H01L 29/06* | (2006.01) | |
| *H01L 29/786* | (2006.01) | |
| *H01L 29/423* | (2006.01) | |

(52) U.S. Cl.
CPC .... *H01L 29/78609* (2013.01); *H01L 29/0673* (2013.01); *H01L 29/42392* (2013.01); *H01L 29/78603* (2013.01); *H01L 29/78654* (2013.01); *H01L 29/78696* (2013.01)

(58) Field of Classification Search
None
See application file for complete search history.

(56) References Cited

U.S. PATENT DOCUMENTS

| | | |
|---|---|---|
| 8,895,371 B2 | 11/2014 | Cao et al. |
| 8,900,959 B2 | 12/2014 | Chang et al. |
| 8,969,934 B1 | 3/2015 | Cheng et al. |
| 8,987,794 B2 | 3/2015 | Rachmady et al. |
| 8,994,081 B2 | 3/2015 | Leobandung |
| 9,029,835 B2 | 5/2015 | Chu-King et al. |
| 2013/0341704 A1 | 12/2013 | Rachmady et al. |
| 2014/0001441 A1 | 1/2014 | Kim et al. |
| 2014/0206160 A1* | 7/2014 | Chou ................ H01L 29/42364 438/200 |
| 2014/0239393 A1* | 8/2014 | Kuo ...................... H01L 29/785 257/347 |
| 2014/0291772 A1 | 10/2014 | Rachmady et al. |
| 2015/0035071 A1 | 2/2015 | Ching et al. |
| 2015/0090958 A1 | 4/2015 | Yang et al. |
| 2015/0104918 A1 | 4/2015 | Liu et al. |
| 2017/0162447 A1* | 6/2017 | Glass .............. H01L 21/823821 |
| 2017/0162583 A1* | 6/2017 | Lee ..................... H01L 27/1104 |
| 2017/0263706 A1* | 9/2017 | Gardner ............... H01L 29/267 |

* cited by examiner

*Primary Examiner* — Ali Naraghi
(74) *Attorney, Agent, or Firm* — F. Chau & Associates, LLC

(57) ABSTRACT

A semiconductor device includes a substrate. A planar insulating layer is disposed on an upper surface of the substrate. A channel region is disposed above the planar insulating layer. A gate electrode is disposed on the channel region. The semiconductor device includes a source region and a drain region. Each of the source region and the drain region is disposed on the substrate and is connected to the channel region. The planar insulating layer has a length equal to or greater than a length of the channel region, and the planar insulating layer includes first and second insulating layers having different permittivities.

20 Claims, 40 Drawing Sheets

II-II'

I-I'

I-I'

I-I'

I-I'

I-I'

I-I'

I-I'

I-I'

I-I'

I-I'

I-I'

SEMICONDUCTOR DEVICE HAVING A PLANAR INSULATING LAYER

CROSS-REFERENCE TO RELATED APPLICATION(S)

This application claims priority under 35 U.S.C. § 119 to Korean Patent Application No. 10-2015-0179992, filed on Dec. 16, 2015, in the Korean Intellectual Property Office, the disclosure of which is incorporated by reference herein in its entirety.

TECHNICAL FIELD

The inventive concept relates to a semiconductor device, and more particularly, to a semiconductor device having a planar insulating layer.

DISCUSSION OF THE RELATED ART

Semiconductor devices are widely used in the electronics industry. Storage devices for storing data, processors for processing data, and the like, may include semiconductor devices. A three-dimensional structure of a semiconductor device allows for a higher capacity in a smaller device. However, limitations are encountered when reducing the size of a semiconductor element included in the three-dimensional semiconductor device.

SUMMARY

According to an exemplary embodiment of the inventive concept, a semiconductor device has a long leakage path and a reduced parasitic capacitance.

According to an exemplary embodiment of the inventive concept, a semiconductor device has a reduced current leakage and a reduced parasitic capacitance.

According to an exemplary embodiment of the inventive concept, a semiconductor device includes a substrate. A planar insulating layer is disposed on an upper surface of the substrate. A channel region is disposed above the planar insulating layer. A gate electrode is disposed on the channel region. The semiconductor device includes a source region and a drain region. Each of the source region and the drain region is disposed on the substrate and is connected to the channel region. The planar insulating layer has a length equal to or greater than a length of the channel region, and the planar insulating layer includes first and second insulating layers having different permittivities.

According to an exemplary embodiment of the inventive concept, a semiconductor device includes a source region and a drain region, each of the source and drain regions being extended in a direction perpendicular to an upper surface of the substrate. A plurality of nanosheets is disposed on the substrate and is separated from the substrate. The plurality of nanosheets is disposed between the source and drain regions, and each of the plurality of nanosheets is parallel with the upper surface of the substrate. A gate electrode is disposed between the source and drain regions to surround the plurality of nanosheets. A planar insulating layer is disposed between the substrate and the plurality of nanosheets. The planar insulating layer has a length that is greater than a length of each of the plurality of nanosheets. The planar insulating layer includes a first insulating layer and a second insulating layer, the second insulating layer having a higher permittivity than a permittivity of the first insulating layer.

According to an exemplary embodiment of the inventive concept, a semiconductor device includes a substrate including a protrusion. The protrusion extends in a first direction. At least one nanosheet is disposed on the substrate. A channel region is formed in the at least one nanosheet. A planar insulating layer is disposed between the protrusion and the at least one nanosheet. A gate electrode is disposed adjacent to the at least one nanosheet. The semiconductor device includes a source region and a drain region. Each of the source region and the drain region is disposed on the substrate, and each of the source region and the drain region is connected to the at least one nanosheet. The planar insulating layer includes first and second insulating layers having different permittivities, and at least a portion of the planar insulating layer is disposed between a source region and the protrusion, and between a drain region and the protrusion.

BRIEF DESCRIPTION OF THE DRAWINGS

The above and other aspects and features of the inventive concept will become more apparent by describing in detail exemplary embodiments thereof in conjunction with the accompanying drawings, in which.

DETAILED DESCRIPTION OF THE EMBODIMENTS

Hereinafter, example embodiments of inventive concepts will be described as follows with reference to the attached drawings.

Figure 1:
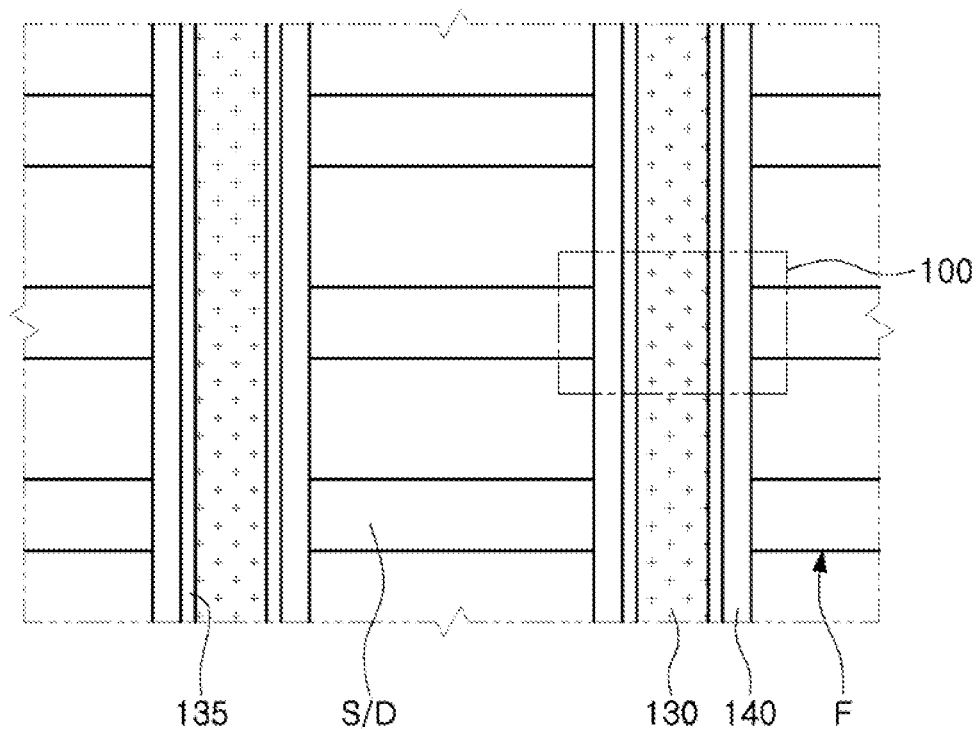
FIG. 1 is a plan view of a semiconductor device according to an exemplary embodiment of the inventive concept.

FIG. 1 is a plan view of a semiconductor device according to an exemplary embodiment of the inventive concept.

With reference to FIG. 1, a semiconductor device 10 may include a plurality of fin structures F, which are active areas, and a plurality of gate electrodes 130, formed to intersect the fin structures F. The plurality of fin structures F may be formed in a direction perpendicular to that of an upper surface of a substrate (x-y plane in FIG. 1) including a semiconductor material. The plurality of fin structures F may provide source/drain regions doped with an impurity. A channel region may be formed between the source/drain regions. The source/drain regions may be referred to as S/D in the drawings.

A channel region may pass through the gate electrode 130. The gate electrode 130 may be formed to surround the channel region and to intersect the plurality of fin structures F. The channel region may be included in a nanosheet disposed between the source/drain regions. The nanosheet, in an exemplary embodiment of the inventive concept, may have a thickness in the range of one to tens of nanometers. The nanosheet may be, for example, only several atoms thick.

The gate electrode 130 may be formed of a conductive material, such as a metal, metal silicide, polysilicon, or the like. A gate insulating layer 135 and spacers 140 may be disposed on sides of the gate electrode 130. The gate insulating layer 135 may be formed to surround the channel region and intersect the plurality of fin structures F. The gate electrode 130 may be extended in one direction (e.g., the y-axis direction, in FIG. 1), while being in contact with the fin structures F. In an exemplary embodiment of the inventive concept, spatial intervals between the gate electrodes 130 may be in the range of tens of nanometers.

According to an exemplary embodiment of the inventive concept, in the semiconductor device 10, the gate insulating layer 135 may include a plurality of layers. In an exemplary embodiment of the inventive concept, the gate insulating layer 135 may include first and second insulating layers, which may have different permittivities. For example, when the first insluting layer is disposed closer to the channel region than the second insulating layer, the second insulating layer being disposed on the first insulating layer, the first insulating layer may have a lower permittivity than that of the second insulating layer.

Figure 2:
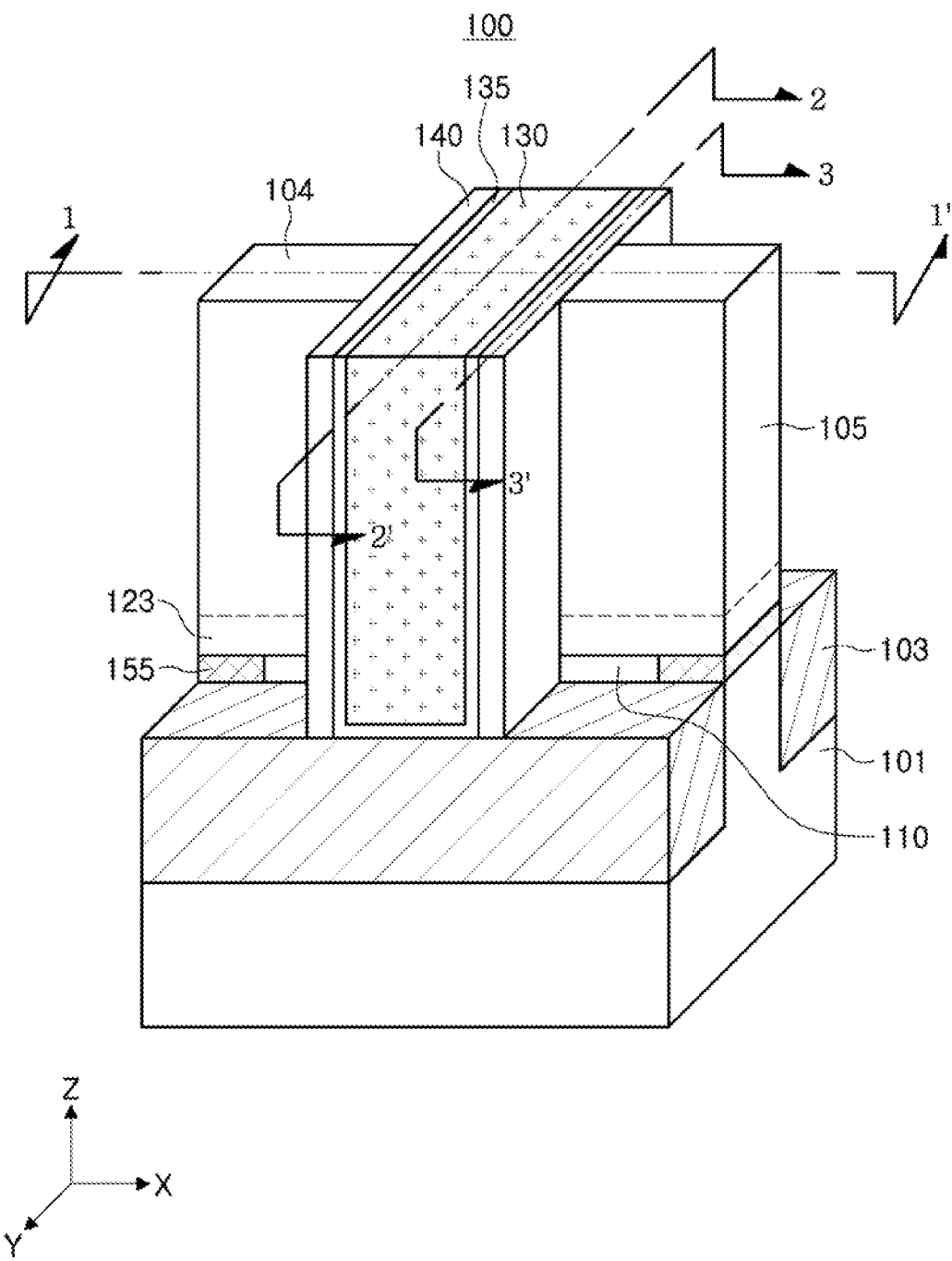
FIG. 2 is a perspective view of a portion of a semiconductor device according to an exemplary embodiment of the inventive concept.

FIG. 2 is a perspective view of a portion of a semiconductor device according to an exemplary embodiment of the inventive concept.

With reference to FIG. 2, a semiconductor device 100, according to an exemplary embodiment of the inventive concept, may include a substrate 101, source/drain regions 104 and 105 formed on the substrate, and a gate electrode 130 formed to intersect the source/drain regions 104 and 105. The gate electrode 130 may be formed to surround a channel region disposed between the source/drain regions 104 and 105. In addition, the gate insulating layer 135 and the spacers 140 may be disposed on sides of the gate electrode 130. The gate insulating layer 135 may also be disposed between the gate electrode 130 and the channel region.

The channel region may be included in a nanosheet. The nanosheet may be disposed between the source/drain regions 104 and 105. In addition, a nanosheet, for example, a third nanosheet 123, may be disposed in a lower portion of the source/drain regions 104 and 105. The nanosheet 123 may have a thickness and height in the range of one to tens of nanometers.

A substrate insulating layer 103 is provided on the substrate 101. The substrate insulating layer 103 may be disposed to surround (e.g., cover) a portion of the substrate 101. In an exemplary embodiment of the inventive concept, a portion of the substrate 101 may protrude upwardly (e.g., in the Z direction, as shown in FIG. 2) to be connected to a planar insulating layer 110, the source/drain regions 104 and 105, and/or other elements. The substrate insulating layer 103 may be disposed to surround sides of the protruding portion of the substrate 101. An upper surface of the substrate insulating layer 103 may be coplanar with the substrate 101.

The planar insulating layer 110 may be disposed on an upper surface of the substrate 101 (e.g., on an upper surface of the protruding portion of the substrate 101). The planar insulating layer 110 may include an insulating material, such as silicon oxide, silicon nitride, silicon oxynitride, or a high dielectric constant material. A length of the planar insulating layer 110 may be greater than that of a channel region formed between the source/drain regions 104 and 105. In addition, a residual sacrificial layer 155 may be disposed on two sides of the planar insulating layer 110.

The residual sacrificial layer 155 may be a portion of a sacrificial layer. The sacrificial layer may be provided for the formation of the planar insulating layer 110. The residual sacrificial layer 155 is a portion of the sacrificial layer that remains on the substrate 101 after a manufacturing process removes the sacrificial layer. The residual sacrificial layer 155 may include a semiconductor material undoped with an impurity, for example, silicon germanium (SiGe), or the like. A length of the residual sacrificial layer 155 may be less than that of the source/drain regions 104 and 105, respectively.

In the semiconductor device 100, a leakage path may be formed in a portion of the substrate 101. When a voltage is applied to the source/drain regions 104 and 105, the leakage path may be formed in a portion of the substrate 101 adjacent to a lower portion of the source/drain regions 104 and 105. For example, the leakage path may be formed in a region of the substrate 101 that is adjacent to the lower surfaces of the source/drain regions 104 and 105. In order to prevent the leakage path from being formed, an ion implantation process may be performed on a portion of the substrate 101. When the ion implantation process is performed on the substrate 101, film quality of the upper portion of the substrate 101 may be reduced.

In an exemplary embodiment of the inventive concept, the planar insulating layer 110 may be formed on the upper surface of the substrate 101 to reduce the current flow through the leakage path without reducing the film quality of the substrate 101. A length of the planar insulating layer 110 may be equal to, or greater than that of the channel region. The planar insulating layer 110 may increase the length of the leakage path formed adjacent to the upper surface of the substrate 101. Thus, current flow through the leakage path may be minimized.

In addition, the planar insulating layer 110 may reduce a parasitic capacitance occurring in the substrate 110. When the planar insulating layer 110 is omitted, the residual sacrificial layer 155 may have a relatively large area. Thus, the parasitic capacitance occurring in the substrate 101 may be high. When the planar insulating layer 110 is omitted, the residual sacrificial layer 155 may have an area substantially equal to that of the source/drain regions 104 and 105 in the x-y plane of FIG. 2. In an exemplary embodiment of the inventive concept, the parasitic capacitance may be reduced by forming the planar insulating layer 110. This is because the formation of the planar insulating layer 110 reduces the area of the residual sacrificial layer 155 below the source/drain regions 104 and 105. The planar insulating layer 110 occupies an overlapping area between the substrate 101 and the source/drain 104 and 105 which would have otherwise been occupied by the residual sacrificial layer 155.

Figure 3:
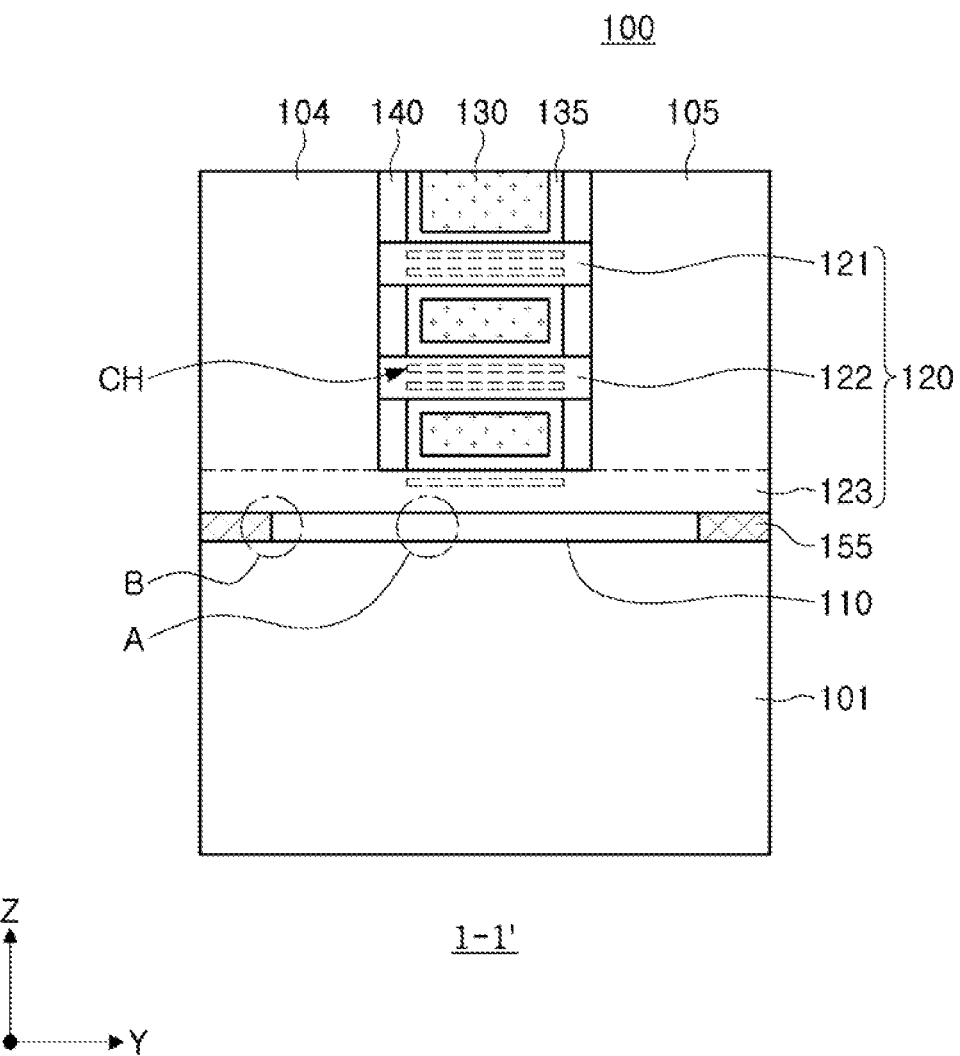
FIG. 3 is a cross-sectional view taken along line 1-1' of the semiconductor device of FIG. 2, according to an exemplary embodiment of the inventive concept.

FIG. 3 is a cross-sectional view taken along line 1-1' of the semiconductor device of FIG. 2, according to an exemplary embodiment of the inventive concept.

With reference to FIG. 3, according to an exemplary embodiment of the inventive concept, the semiconductor device 100 may include the planar insulating layer 110 and the residual sacrificial layer 155 formed on the upper surface of the substrate 101, a plurality of nanosheets 120 formed on the planar insulating layer 110 to provide channel regions CH, and the gate electrode 130 formed to surround the channel regions CH. The nanosheets 120 may include first, second and third nanosheets 121, 122 and 123. The gate insulating layer 135 may be disposed between the gate electrode 130 and the channel regions CH. The spacers 140 may be interposed between the gate electrode 130 and the source/drain regions 104 and 105. The number of, and disposition of, the nanosheets 120 is not limited to the configuration shown in FIG. 3. The number of, and disposition of, the nanosheets 120 may be variously changed.

The channel regions CH may be disposed inside of the plurality of nanosheets 120. The plurality of nanosheets 120 may be formed on the planar insulating layer 110, and at least a portion of the plurality of nanosheets 120, for example, the first and second nanosheets 121 and 122 may be disposed between the source/drain regions 104 and 105. In the nanosheets 120, the channel regions CH may be included at a portion of the respective one of the nanosheets 120 that is disposed adjacent to the gate insulating layer 135 and the gate electrode 130. Thus, as illustrated in FIG. 3, in a lowermost nanosheet 120, for example, in the third nanosheet 123, which is disposed closest to the substrate 101, the channel region CH may be disposed only in an upper portion of the third nanosheet 123. The upper portion of the third nanosheet 123 is disposed adjacent to the gate electrode 130.

A lower portion of the third nanosheet 123 faces the planar insulating layer 110, and the upper portion of the third nanosheet 123 faces the gate insulating layer 135 and the spacer 140. The lower portion of the third nanosheet 123 may be adjacent to the planar insulating layer 110. Thus, a channel region CH might not be disposed in the lower portion of the third nanosheet 123. For example, as shown in FIG. 3, the lower portion of the third nanosheet 123 does not include a channel region CH. Accordingly, an influence in current characteristics of the semiconductor device 100, caused by the reduced capacitance (e.g., parasitic capacitance) of the semiconductor device 100, may be minimized by disposing the planar insulating layer 110 below the third nanosheet 123 (e.g., between the third nanosheet 123 and the substrate 101). Therefore, the current characteristics of the semiconductor device 100, according to an exemplary embodiment of the inventive concept, may be greater than the current characteristics of other semiconductor devices. In addition, the semiconductor device 100 may have a reduced current leakage.

The gate insulating layer 135 may include a plurality of layers, and in an exemplary embodiment of the inventive concept, the gate insulating layer 135 may include the first and second insulating layers. The first insulating layer and the second insulating layer may have different permittivities. The permittivity of the second insulating layer may be higher than that of the first insulating layer. In this case, the second insulating layer may be disposed closer to the gate electrode 130 than the first insulating layer. For example, the first insulating layer may be disposed closer to the channel region CH than the second insulating layer. In a similar manner, disposing the first insulating layer, having a relatively low level of permittivity closer to the channel region CH than the second insulating layer, having a relatively high level of permittivity, and adjusting an energy band at the same height as a barrier, may increase the characteristics of a memory device using the semiconductor 100. For example, speed and efficiency of a memory device using the semiconductor 100 may be increased.

The second insulating layer having the higher permittivity may include silicon oxide ($SiO_2$), silicon nitride ($Si_3N_4$), silicon oxynitride (SiON), or a high dielectric constant material. A high dielectric constant material may be a material, such as aluminium oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminium oxide ($LaAl_xO_y$), lanthanum hafnium oxide ($LaHf_xO_y$), hafnium aluminium oxide ($HfAl_xO_y$), and praseodymium oxide ($Pr_2O_3$).

Figure 4A:
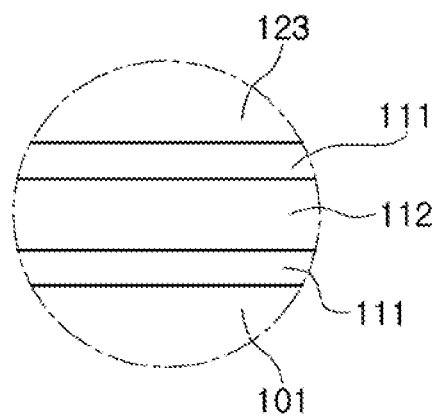
FIGS. 4A and 4B, respectively, are enlarged views of regions A and B of the memory device illustrated in FIG. 3, according to an exemplary embodiment of the inventive concept.
Figure 4B:
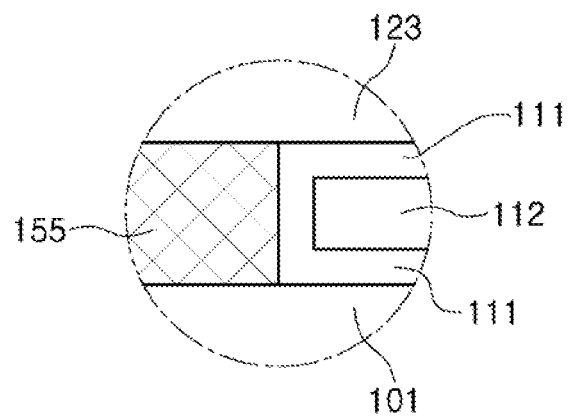

FIGS. 4A and 4B, respectively, are enlarged views of regions A and B of the memory device illustrated in FIG. 3, according to an exemplary embodiment of the inventive concept.

With reference to FIG. 4A, which is the enlarged view of region A, the planar insulating layer 110 may include a first insulating layer 111 and a second insulating layer 112. The second insulating layer 112 may be surrounded by the first insulating layer 111. For example, the second insulating layer 112 may be disposed in a cavity within the first insulating layer 111. The first insulating layer 111 may be disposed between the nanosheets 120 (e.g., the third nanosheet 123) and the substrate 101. In a manufacturing process, the first insulating layer 111 may be formed before the second insulating layer 112. After the first insulating layer 111 is formed through a process, such as atomic layer deposition (ALD), chemical vapor deposition (CVD), or the like, the cavity within the first insulating layer 111 may be filled with the second insulating layer 112.

With reference to FIG. 4B, which is an enlarged view of region B, the residual sacrificial layer 155 may be disposed on two sides (e.g., two opposite sides) of the planar insulating layer 110. Since the first insulating layer 111 is disposed to surround the second insulating layer 112, the residual sacrificial layer 155 may contact the first insulating layer 111, as illustrated in FIG. 4B. For example, as shown in FIGS. 3 and 4B, the first insulating layer 111 may be disposed between the second insulating layer 112 and the residual sacrificial layer 155, at each of the two opposite sides of the planar insulating layer 110 on which the residual sacrificial layer 155 is disposed.

The first insulating layer 111 and the second insulating layer 112, included in the planar insulating layer 110, may be formed during the same process as that of the first insulating layer and the second insulating layer, included in the gate insulating layer 135. For example, the planar insulating layer 110 and the gate insulating layer 135 may be formed through a single manufacturing process. In order to form the planar insulating layer 110 and the gate insulating layer 135 through a single process, a thickness of the planar insulating layer 110 may be equal to twice that of the gate insulating layer 135, or less than twice that of the gate insulating layer 135. In the case when the thickness of the planar insulating layer 110 is greater than twice that of the gate insulating layer 135, the planar insulating layer 110 might not be completely filled with the first insulating layer 111 and the second insulating layer 112. In this case, a third insulating layer, different from the first insulating layer 111 and the second insulating layer 112, may be further included in the planar insulating layer 110 to fill the gap between the substrate 101 and the nanosheets 120 (e.g., the third nanosheet 123).

Figure 5:
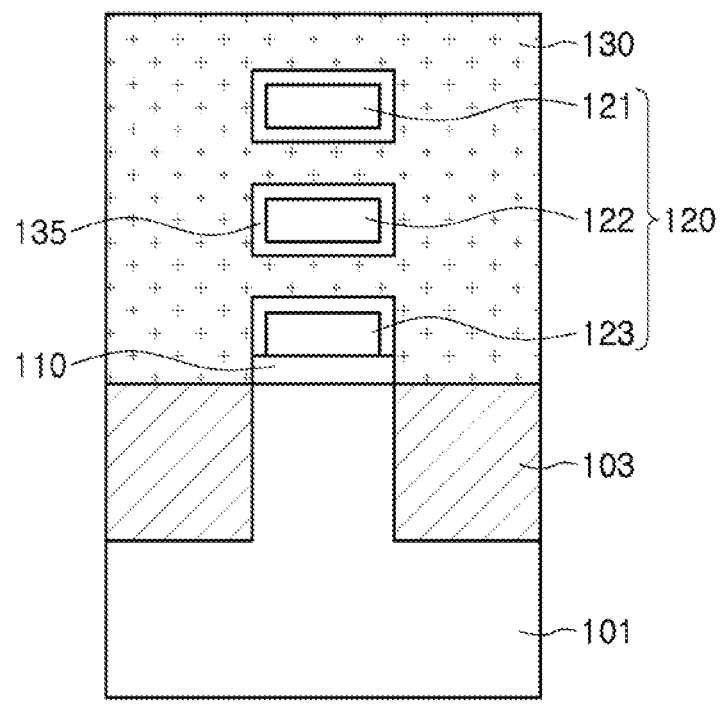
FIG. 5 is a cross-sectional view taken along line 2-2' of the memory device illustrated in FIG. 2, according to an exemplary embodiment of the inventive concept.

FIG. 5 is a cross-sectional view taken along line 2-2' of the memory device illustrated in FIG. 2, according to an exemplary embodiment of the inventive concept.

With reference to FIG. 5, the planar insulating layer 110 and the plurality of nanosheets 121 to 123 (nanosheets 120) may be disposed above the substrate 101. The third nanosheet 123 may be disposed on an upper surface of the planar insulating layer 110, and a first nanosheet 121 and a second nanosheet 122 may be separated from the planar insulating layer 110. In the exemplary embodiment of the inventive concept illustrated with reference to FIG. 5, the first nanosheet 121 and the second nanosheet 122 may be surrounded by the gate insulating layer 135 and the gate electrode 130.

The plurality of nanosheets 120 may extend in a direction of the x-axis. In addition, at least portions of the nanosheets 120 may be adjacent to the gate electrode 130, and connect the source/drain regions 104 and 105 to each other. When a predetermined level of voltage is supplied to the gate electrode 130, the channel regions CH may establish a conductive line between the source/drain regions 104 and 105, adjacent to the gate electrode 130.

The plurality of nanosheets 120 may include the channel regions CH. In addition, the channel regions CH included in the first nanosheet 121 and in the second nanosheet 122 may be different from the channel region CH included in the third nanosheet 123. In an exemplary embodiment of the inventive concept, the regions of the first nanosheet 121 and the second nanosheet 122, adjacent to the gate electrode 130, may include the channel regions CH. The third nanosheet 123 might not include the channel region CH in a lower portion thereof because a lower surface of the third nanosheet 123 in the direction of the z-axis is adjacent to the planar insulating layer 110.

Since a channel region CH is not provided in the lower portion of the third nanosheet 123, and without considering capacitance (e.g., parasitic capacitance) present in the semiconductor device 100, the semiconductor device 100 might seemingly have relatively poor absolute current characteristics.

However, due to presence of the planar insulating layer 110, the semiconductor device 100, according to an exemplary embodiment of the inventive concept, may have excellent current characteristics due to the reduced capacitance (e.g., parasitic capacitance) of the semiconductor device 100. The planar insulating layer 110 may cause the capacitance of the semiconductor device 100 to be decreased, and in turn, the current characteristics of the semiconductor device 100 to be excellent. In addition, the semiconductor device 100 may have a reduced current leakage.

Figure 6:
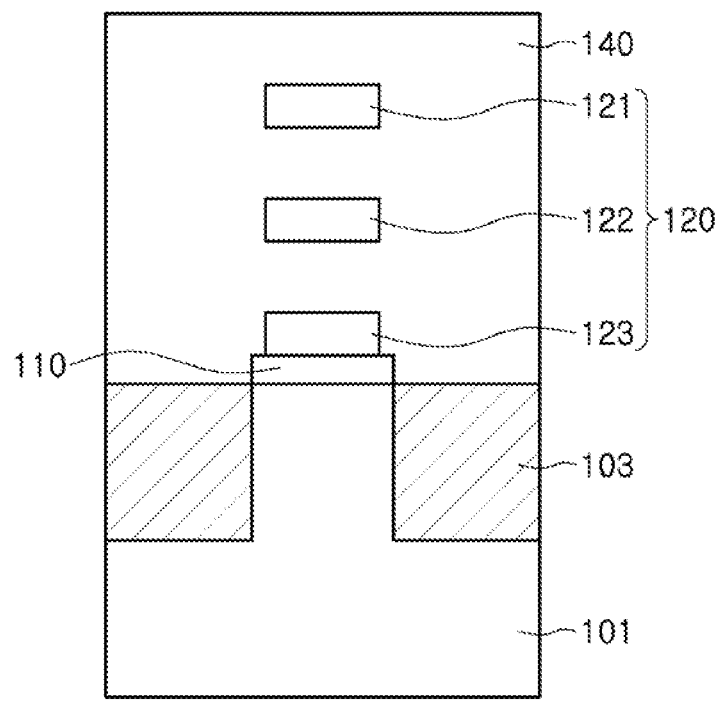
FIG. 6 is a cross-sectional view taken along line 3-3' of the memory device illustrated in FIG. 2, according to an exemplary embodiment of the inventive concept.

FIG. 6 is a cross-sectional view taken along line 3-3' of the memory device illustrated in FIG. 3, according to an exemplary embodiment of the inventive concept.

With reference to FIG. 6, in a cross-section taken along line 3-3', the gate electrode 130 is not illustrated, and a structure of the plurality of nanosheets 120 surrounded by the spacer 140 may be illustrated. In an exemplary embodiment of the inventive concept, the first nanosheet 121 and the second nanosheet 122 may be surrounded by the spacer 140 in the y-axis direction and the z-axis direction. A lower surface of the third nanosheet 123 is in contact with the planar insulating layer 110.

At least portions of the plurality of the nanosheets 120 may pass through the spacer 140 to be connected to the source/drain regions 104 and 105. With reference to FIG. 5 and FIG. 6, two sides (e.g., two opposite sides) of each of the first nanosheet 121 and the second nanosheet 122 may be connected to the source/drain regions 104 and 105. In addition, the first nanosheet 121 and the second nanosheet 122 may be surrounded by the gate electrode 130, the gate insulating layer 135, and the spacers 140 (e.g., surrounded at each side of the first and second nanosheets 121 and 122 facing the source/drain 104 and 105).

Figure 7:
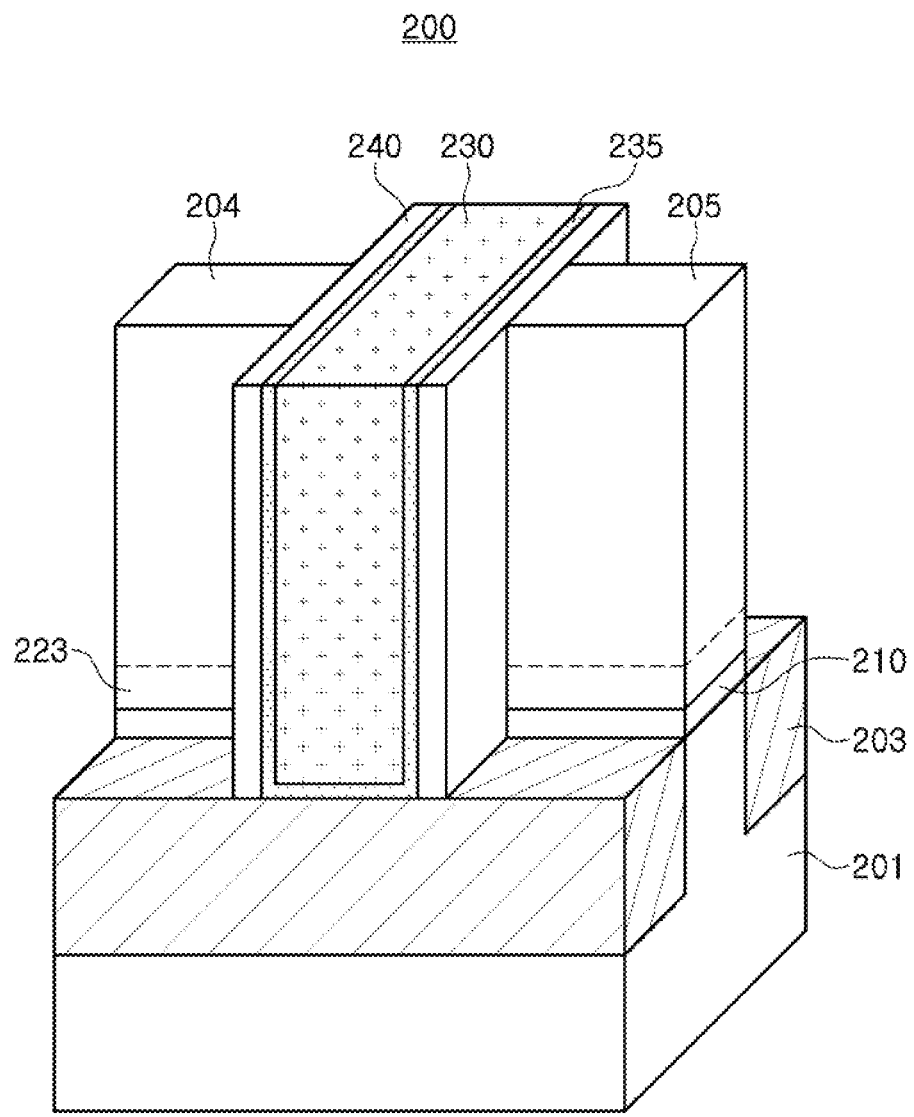
FIGS. 7 and 8 are perspective views of a portion of a semiconductor device according to exemplary embodiments of the inventive concept.
Figure 8:
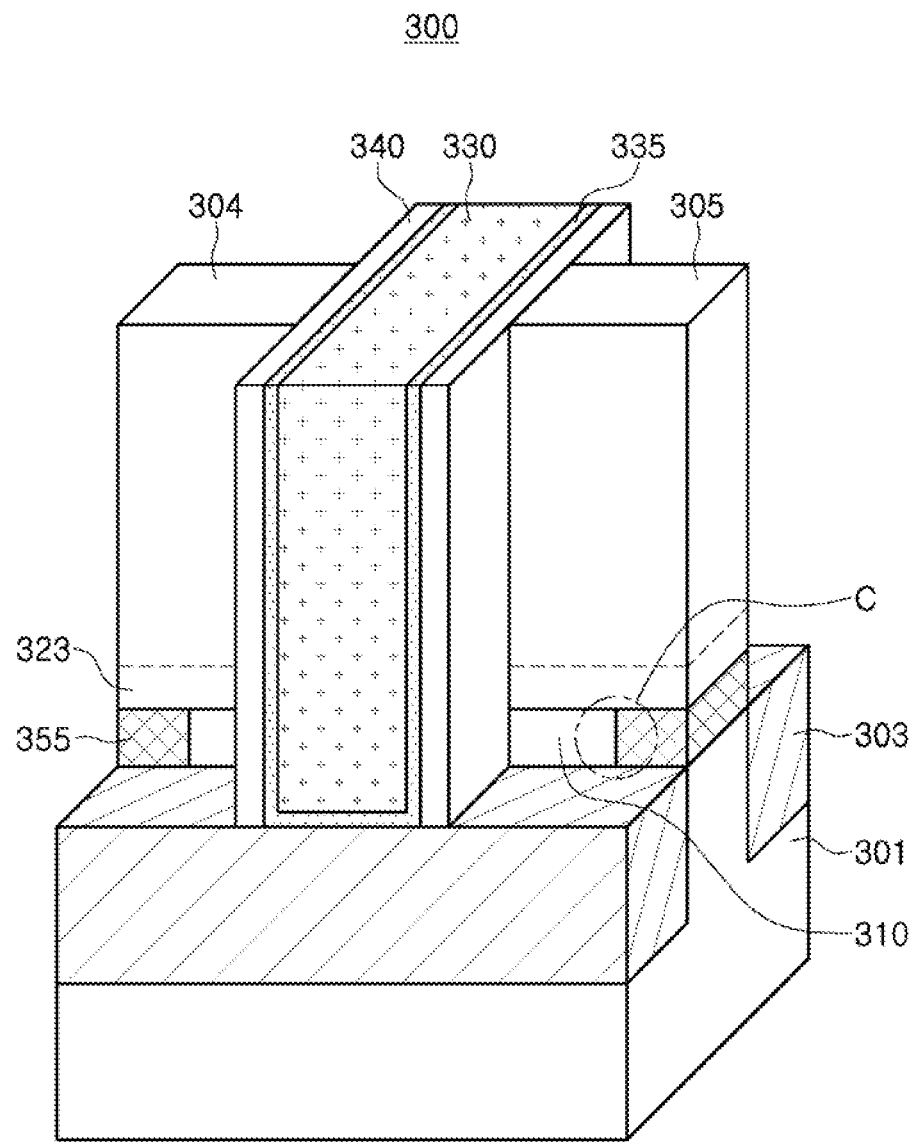

FIGS. 7 and 8 are perspective views of a portion of a semiconductor device according to exemplary embodiments of the inventive concept.

With reference to FIG. 7, according to an exemplary embodiment of the inventive concept, a semiconductor device 200 may include a substrate 201, source/drain regions 204 and 205 formed on the substrate 201 and a gate electrode 230 formed to intersect the source/drain regions 204 and 205. As in the semiconductor device 100 of FIG. 2, a gate insulating layer 235 and spacers 240 may be formed on sides of a gate electrode 230. In addition, a portion of the substrate 201 may protrude upwardly to be connected to the source/drain regions 204 and 205. The portion of the substrate 201 protruding upwardly may be surrounded by a substrate insulating layer 203. A planar insulating layer 210 may be formed on an upper surface of the substrate 201. For example, the planar insulating layer 210 may be formed on an upper surface of the protruding portion of the substrate 201.

In the semiconductor device 200 of FIG. 7, a residual sacrificial layer might not be disposed on two sides of the planar insulating layer 210. In the semiconductor device 100 of FIG. 2, the residual sacrificial layer 155 is disposed on the two ends of the planar insulating layer 110 of the semiconductor device 100. However, a residual sacrificial layer might not be present in the semiconductor device 200 due to a difference in physical properties between the sacrificial layers used in a manufacturing process to form the planar insulating layer 110 and the sacrificial layers used in a manufacturing process to form the planar insulating layer 210.

For example, the planar insulating layer 110 or 210 may be formed by removing a sacrificial layer disposed between the third nanosheet 123 and the substrate 101 or between a third nanosheet 223 and the substrate 201, and then filling the space resulting from the removal of the sacrificial layer with an insulating layer. The sacrificial layer may include a material having a predetermined etching selectivity with respect to the third nanosheet 123 or 223, for example, SiGe. When the semiconductor device 200 is formed, a concentration of germanium may increase in the SiGe included in a sacrificial layer. As the concentration of germanium increases, an etching rate of the sacrificial layer may be increased. Thus, the planar insulating layer 210 may be formed to have a structure with no residual sacrificial layer.

With reference to FIG. 8, according to an exemplary embodiment of the inventive concept, a semiconductor device 300 may include source/drain regions 304 and 305 formed on a substrate 301 and a gate electrode 330 intersecting a fin structure F. A gate insulating layer 335 and a spacer 340 may be formed on sides of a gate electrode 330. In addition, a planar insulating layer 310 may be disposed on the substrate 301.

The semiconductor device 300 may include a residual sacrificial layer 355. The thickness of the planar insulating layer 310 of FIG. 8 may be greater than that of the planar insulating layers 110 and 210 of FIGS. 2 and 7. Thus, the internal structure of the planar insulating layer 310 may be different from that of the planar insulating layers 110 and 210.

Figure 9:
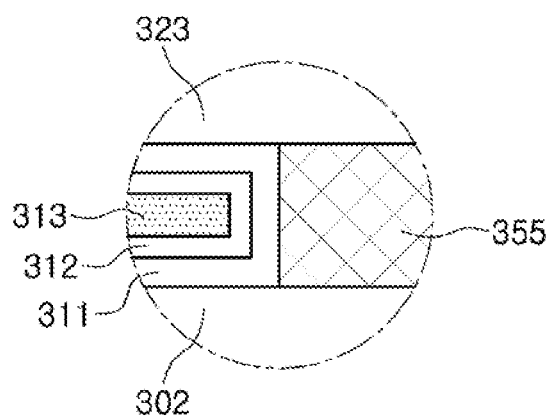
FIG. 9 is an enlarged view of region C of the semiconductor device illustrated in FIG. 8.

FIG. 9 is an enlarged view of region C of the semiconductor device 300 illustrated in FIG. 8.

With reference to FIG. 9, in the semiconductor device 300, the planar insulating layer 310 may include a first insulating layer 311, a second insulating layer 312, and a third insulating layer 313, in a structure in which the thickness of the planar insulating layer 310 is greater than that of the planar insulating layers 110 and 210. The second insulating layer 312 may have a higher permittivity than that of the first insulating layer 311.

FIGS. 10 to 42 are drawings illustrating a method of manufacturing the semiconductor device illustrated in FIG. 3, according to an exemplary embodiment of the inventive concept.

Figure 10:
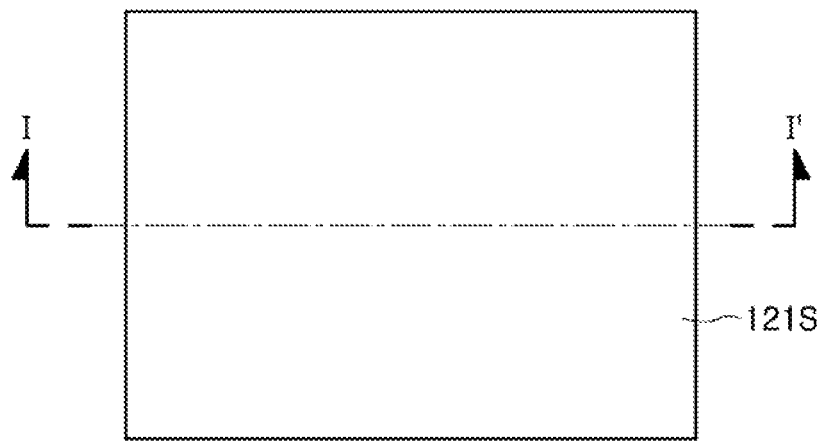
FIGS. 10 to 42 are drawings illustrating a method of manufacturing the semiconductor device illustrated in FIG. 3, according to an exemplary embodiment of the inventive concept.
Figure 11:
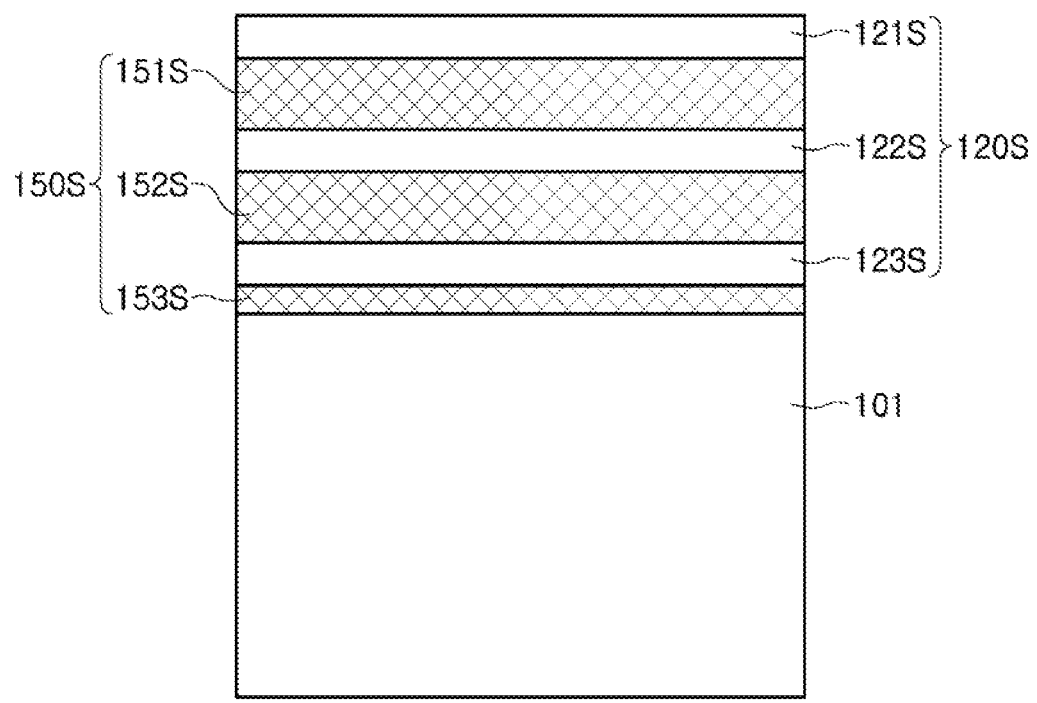

With reference to FIGS. 10 and 11, a plurality of semiconductor layers 121S to 123S (semiconductor layers 120S) and a plurality of sacrificial layers 151S to 153S (sacrificial layers 150S) may be alternately stacked on the substrate 101. The plurality of semiconductor layers 120S may include a semiconductor material, and the plurality of sacrificial layers 150S may include a material having a predetermined etching selectivity with respect to the plurality of semiconductor layers 120S. In an exemplary embodiment of the inventive concept, the plurality of semiconductor layers 120S may include silicon (Si), like the substrate 101, and the plurality of sacrificial layers 150S may include SiGe.

Respective thicknesses of the plurality of semiconductor layers 120S and sacrificial layers 150S may be variously changed. In an exemplary embodiment of the inventive concept, thicknesses of the plurality of semiconductor layers 120S may be less than those of the plurality of sacrificial layers 150S. In addition, a lowermost layer among the plurality of sacrificial layers 150S, for example, the third sacrificial layer 153S may have a thickness less than that of the first sacrificial layer 151S and the second sacrificial layer 152S, respectively. The third sacrificial layer 153S may be replaced with the planar insulating layer 110 in a subsequent process. Accordingly, the thickness of the third sacrificial layer 153S may be less than that of the first sacrificial layer 151S and the second sacrificial layer 152S, respectively. In an exemplary embodiment of the inventive concept, the thickness of the third sacrificial layer 153S may be substantially equal to that of the plurality of semiconductor layers 120S, respectively.

When the plurality of sacrificial layers 150S include SiGe, concentrations of germanium included in the respective sacrificial layers 150S may be different from each other. In an exemplary embodiment of the inventive concept, the lowermost third sacrificial layer 153S may have a higher concentration of germanium than that of the first sacrificial layer 151S and the second sacrificial layer 152S. Thus, in a subsequent etching process of selectively removing the sacrificial layers 150S, the third sacrificial layer 153S may be removed faster than the first sacrificial layer 151S and the second sacrificial layer 152S.

Figure 12:
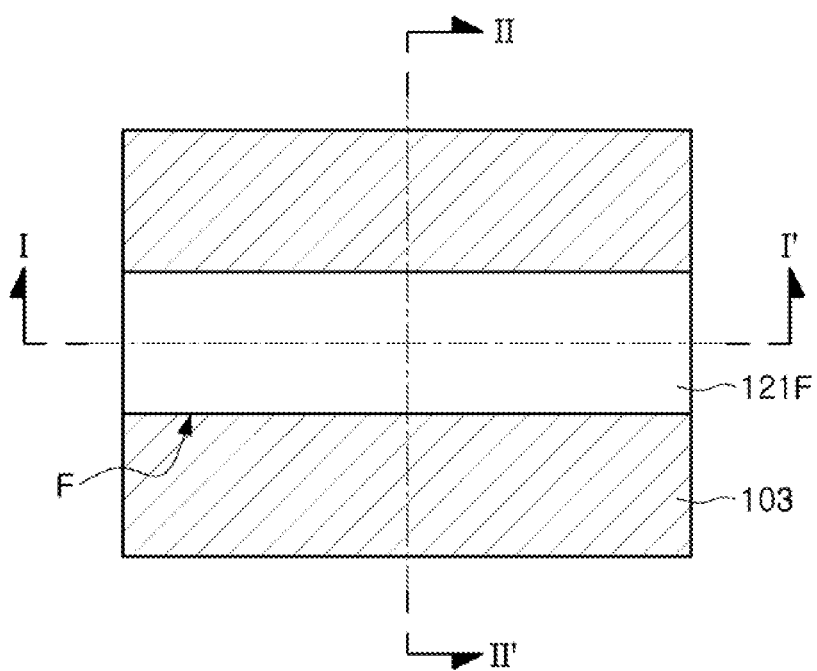
Figure 13:
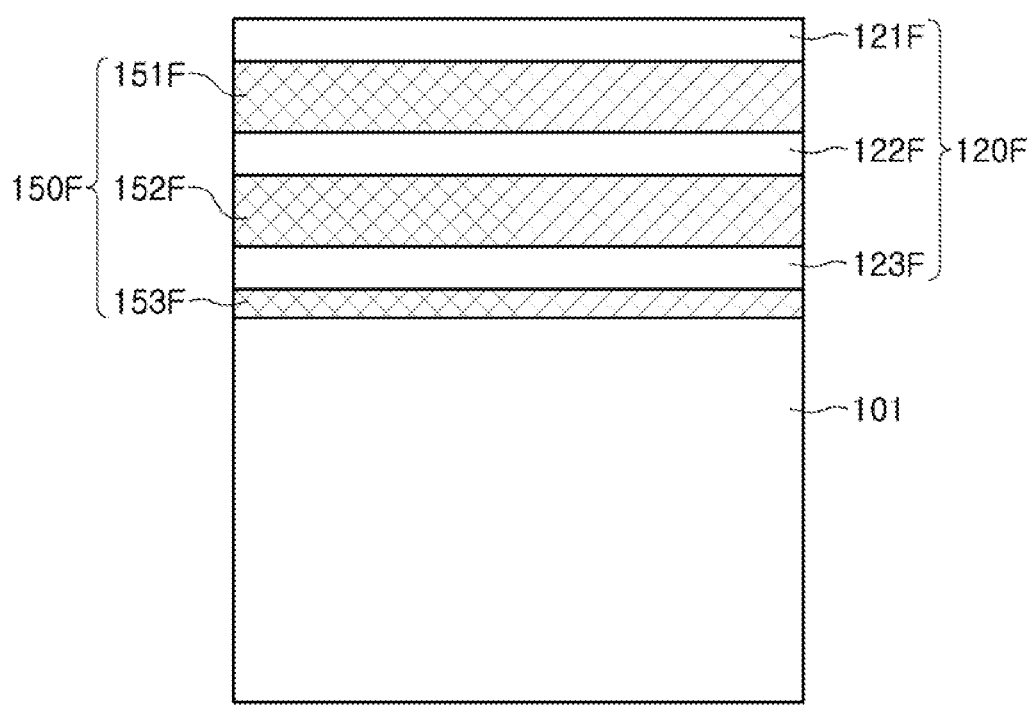
Figure 14:
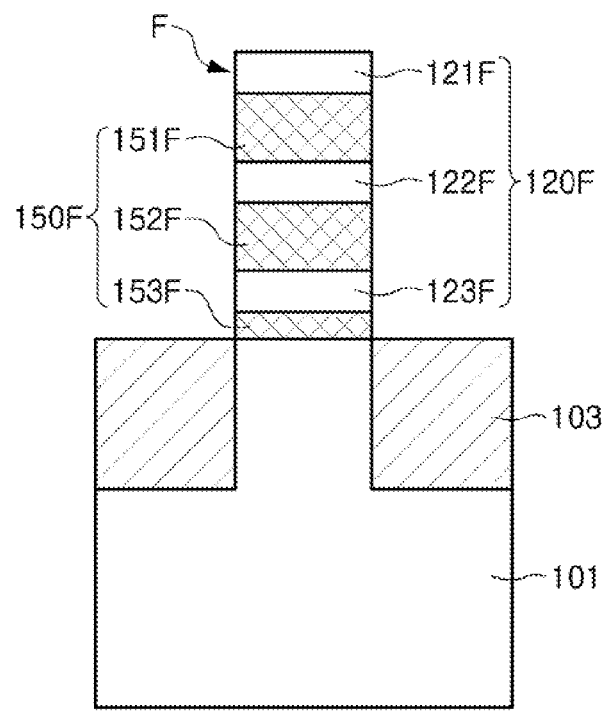

With reference to FIGS. 12 to 14, the fin structure F may be formed by removing portions of the plurality of semiconductor layers 120S and sacrificial layers 150S. FIGS. 13 and 14 may be cross-sectional views taken along lines I-I' and II-II' of FIG. 12. With reference to FIGS. 13 and 14, the fin structure F may include a plurality of semiconductor layers 121F to 123F (semiconductor layers 120F) and sacrificial layers 151F to 153F (sacrificial layers 150F), alternately stacked.

In order to form the fin structure F, at least a portion of the substrate 101 may be removed from the upper surface thereof, and the substrate insulating layer 103 may be disposed on the substrate 101. In this case, the upper surface of the substrate insulating layer 103 may be coplanar with that of the substrate 101. A thickness of the substrate insulating layer 103 may be properly adjusted to prevent the substrate insulating layer 103 from covering the lowermost third sacrificial layer 153F.

As illustrated in FIG. 1, the fin structure F may be extended on the substrate 101 in a specific direction, for example, in the direction of the x-axis. The fin structures F may be disposed at predetermined spatial intervals therebetween. In an exemplary embodiment of the inventive concept, a respective width of and a spatial interval between the fin structures F in the direction of the y-axis may be in the range of tens of nanometers, for example, around 15 nm and around 25 nm, respectively. In an exemplary embodiment of the inventive concept, a thickness of each of the plurality of semiconductor layers 120F in the fin structure F may be equal to or less than 10 nm. Thicknesses of the first sacrificial layer 151F and the second sacrificial layer 152F may be around 15 nm, while a thickness of the third sacrificial layer 153F may be less than that of the first sacrificial layer 151F and the second sacrificial layer 152F.

Figure 15:
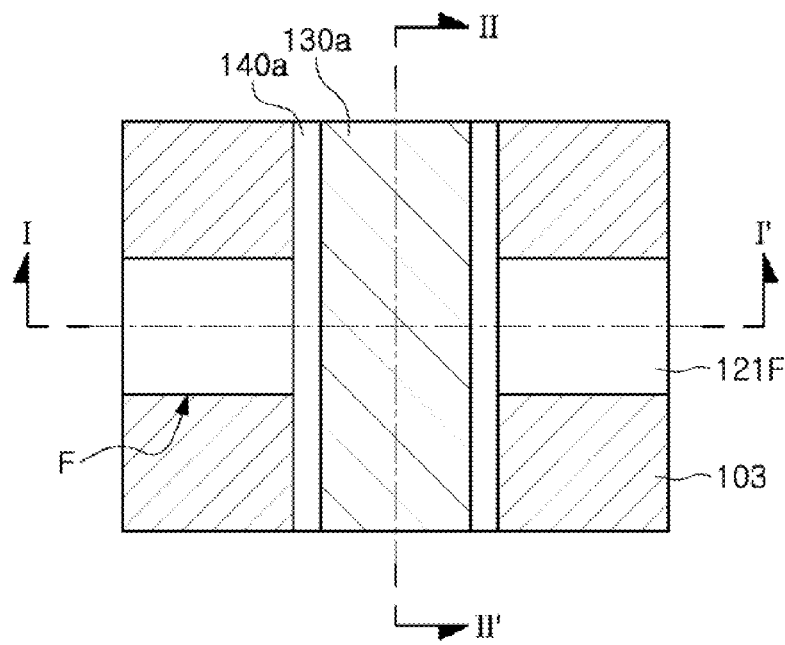
Figure 16:
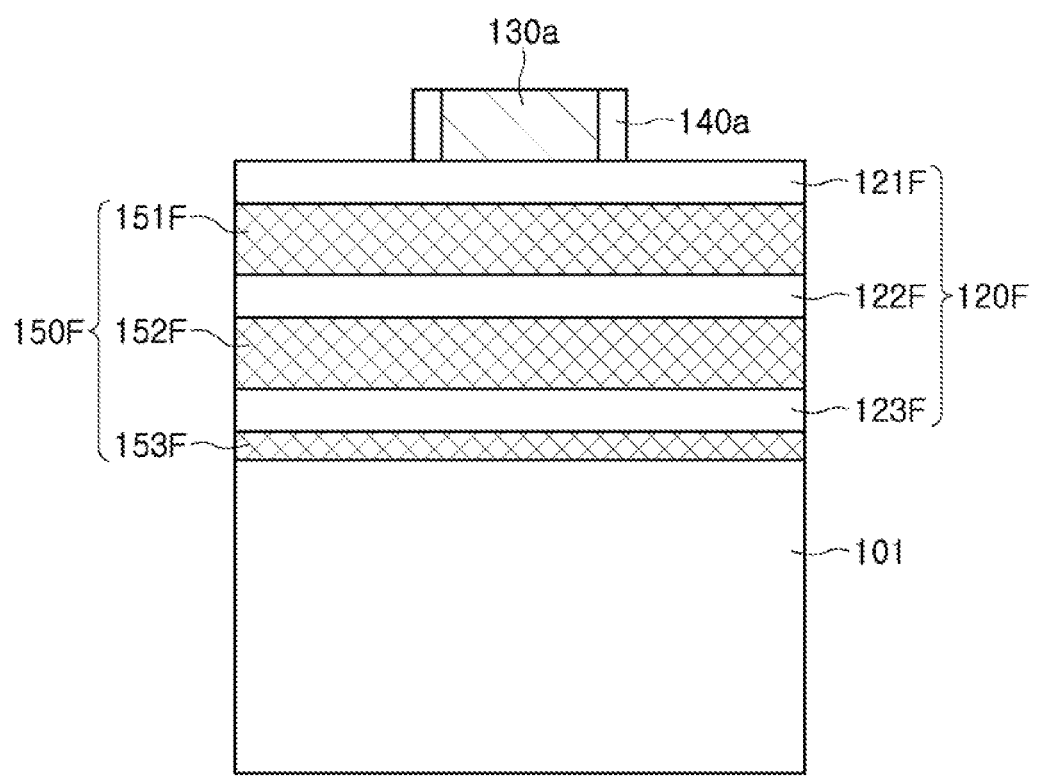
Figure 17:
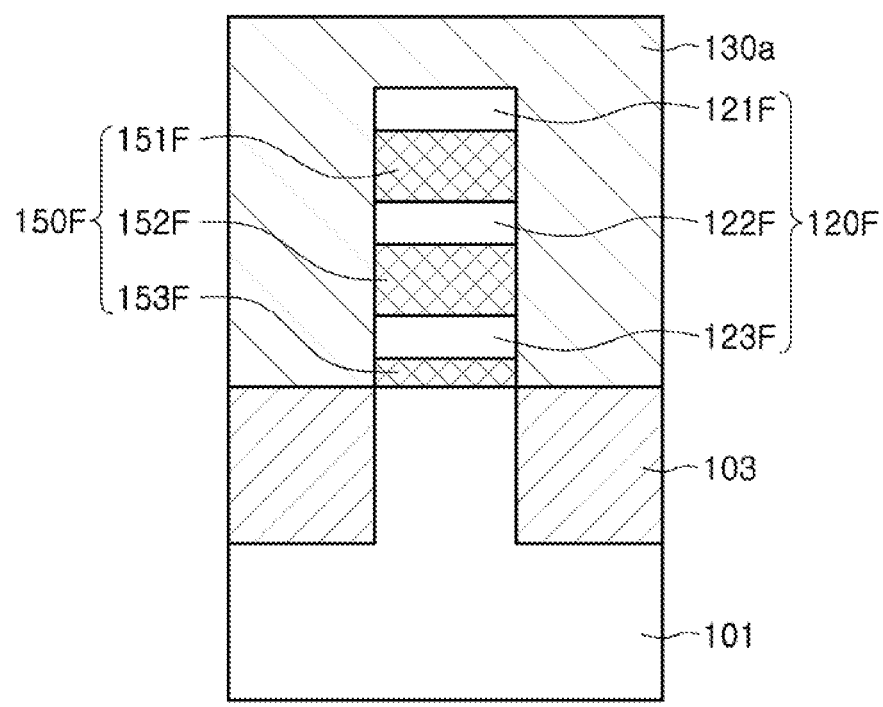
Figure 18:
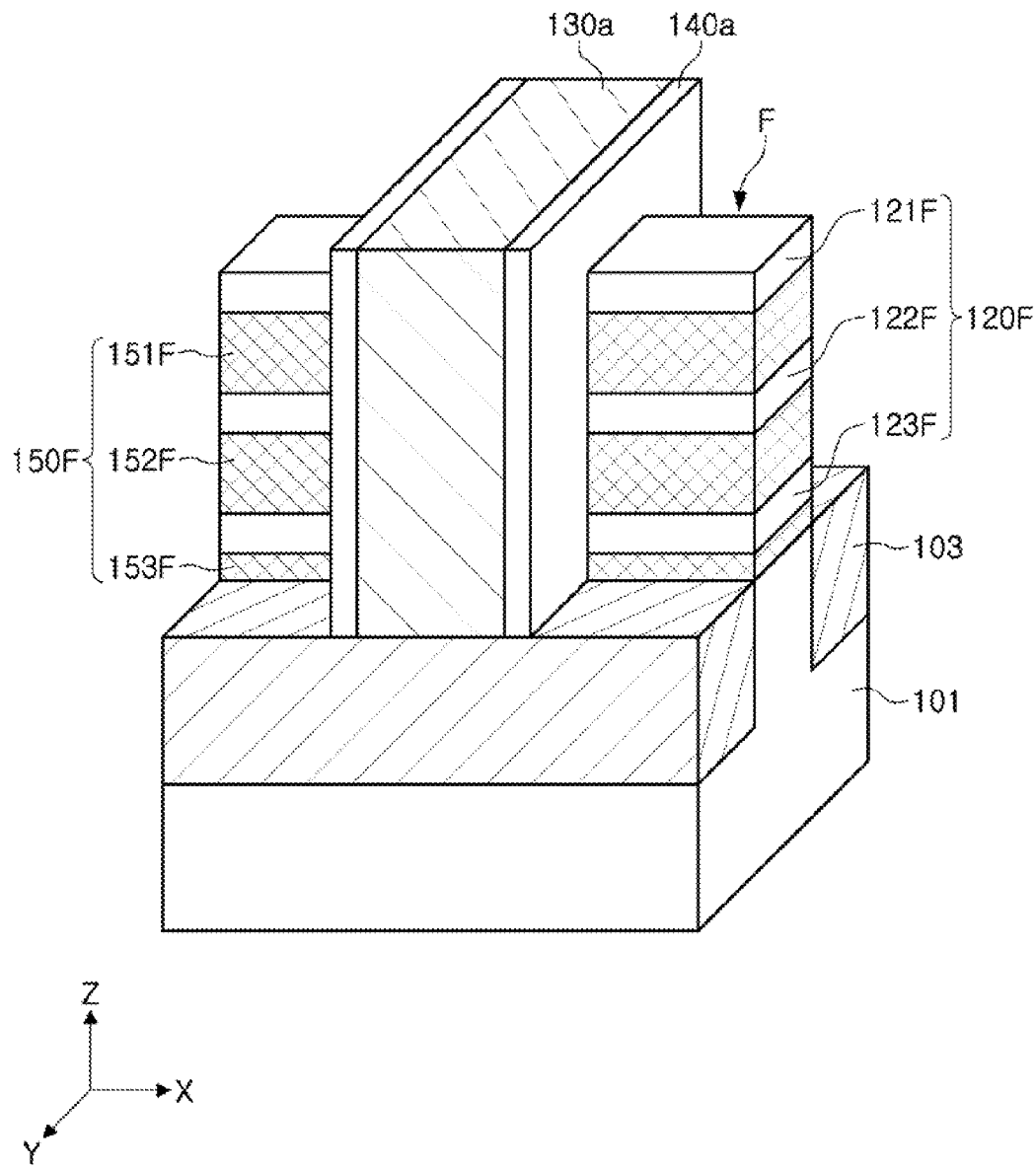

With reference to FIG. 15, a dummy gate electrode 130a and the first spacers 140a may be formed on the fin structure F. In an exemplary embodiment of the inventive concept, a capping layer may also be formed on the dummy gate electrode 130a. In addition, an etch stop layer may be formed between the dummy gate electrode 130a and the plurality of semiconductor layers 120F. Details thereof will be described below with reference to FIGS. 16 to 18. FIGS. 16 and 17 are cross-sectional views taken along lines I-I' and II-II' of FIG. 15. FIG. 18 is a perspective view of the semiconductor device of FIG. 15, according to an exemplary embodiment of the inventive concept.

With reference to FIGS. 15 to 18, the dummy gate electrode 130a and the first spacers 140a may be formed to contact the fin structure F. The dummy gate electrode 130a may be formed of polysilicon, or the like, and the first spacers 140a may be formed using an insulating material, such as SiO₂, or the like.

Figure 19:
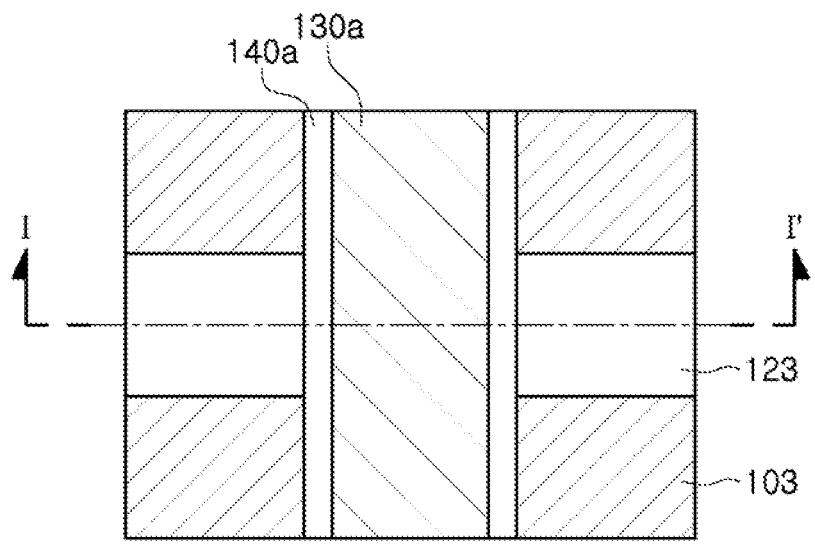
Figure 20:
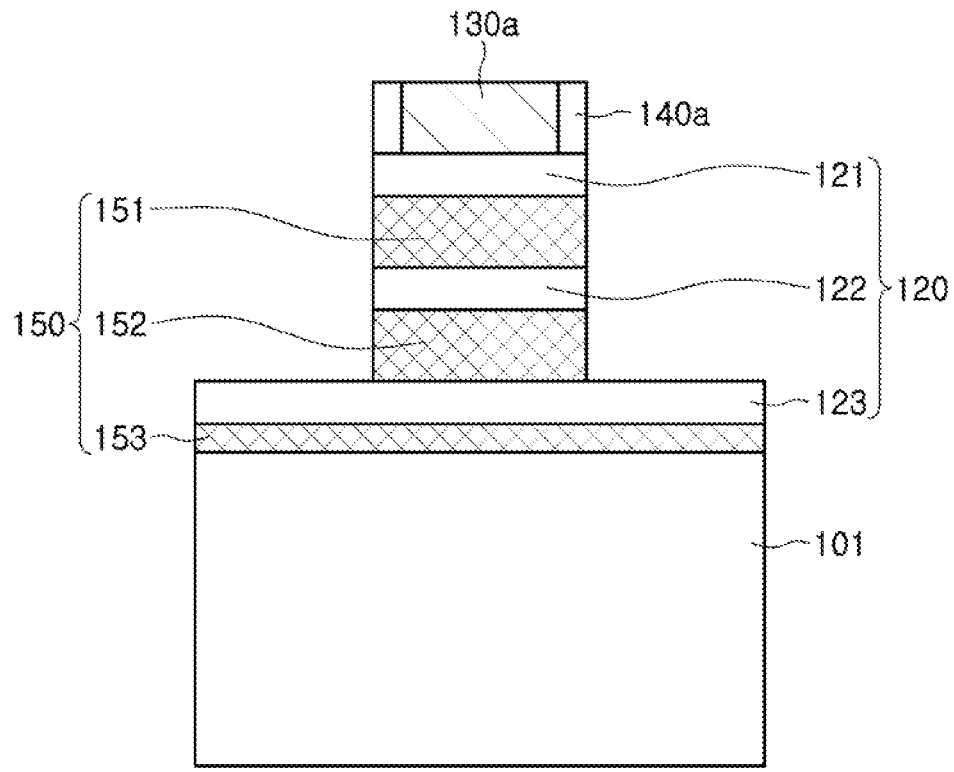
Figure 21:
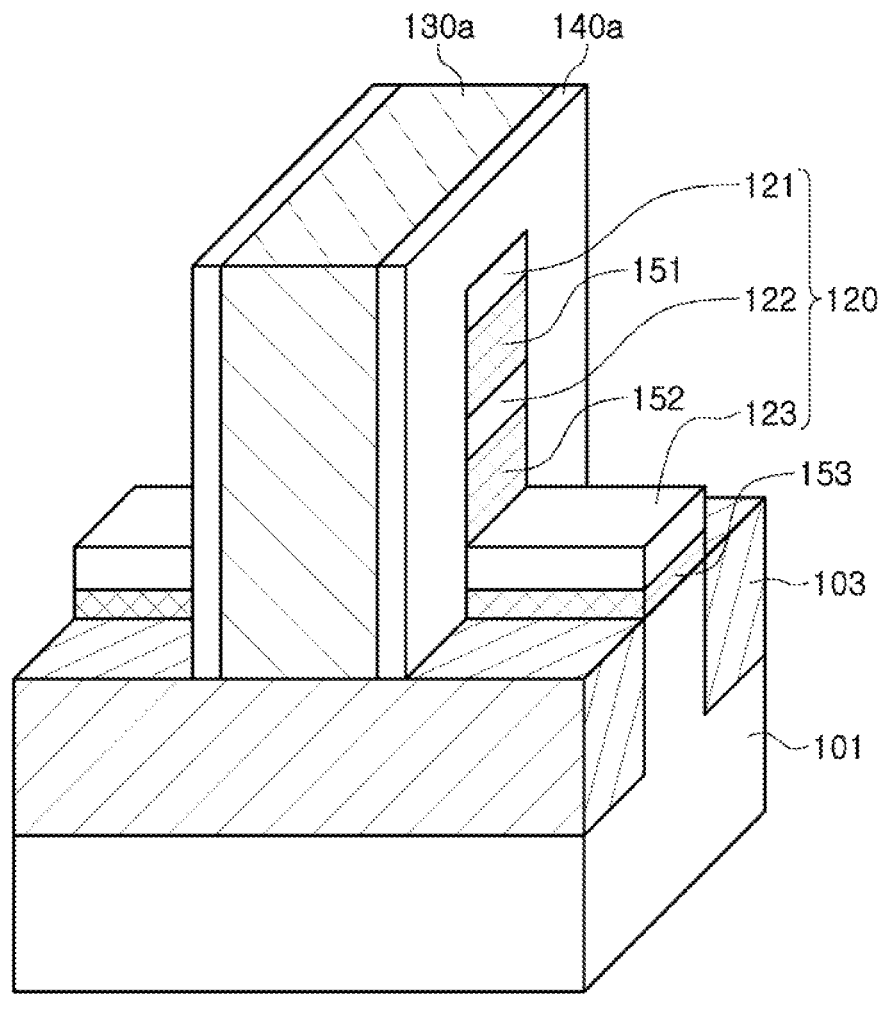

With reference to FIGS. 19 to 21, through an etching process in which the dummy gate electrode 130a and the first spacers 140a are used as mask patterns, at least portions of the plurality of semiconductor layers 120F and sacrificial layers 150F may be removed to form the first, second and third nanosheets 121, 122 and 123 (nanosheets 120). The plurality of nanosheets 120 may be respectively surrounded by the dummy gate electrode 130a and the first spacers 140a. A length of the third nanosheet 123 may be greater than that of the first nanosheet 121 and the second nanosheet 122. The length of the nanosheets 120 can be measured along the x-axis direction, in FIG. 21.

As illustrated in FIGS. 19 to 21, a portion of an upper surface of the third nanosheet 123 may be exposed externally from the dummy gate electrode 130a and the first spacers 140a. The third nanosheet 123 exposed externally may be used to form the source/drain regions 104 and 105 using an epitaxy process.

Figure 22:
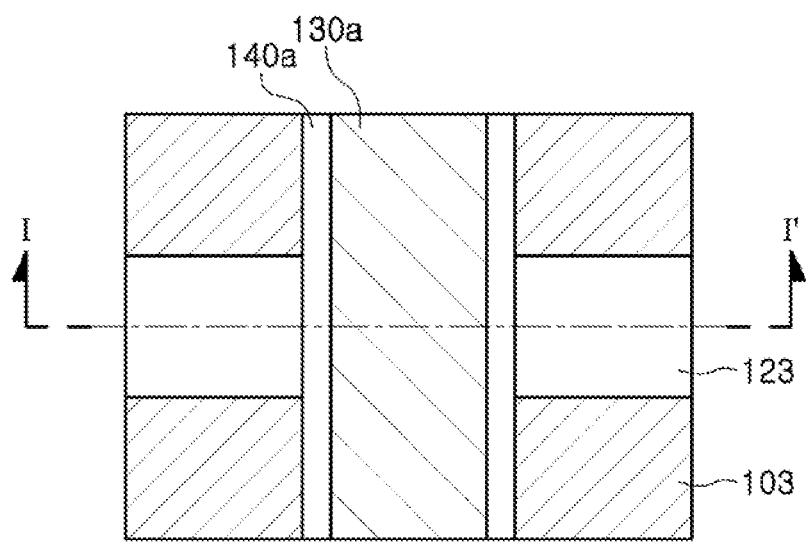
Figure 23:
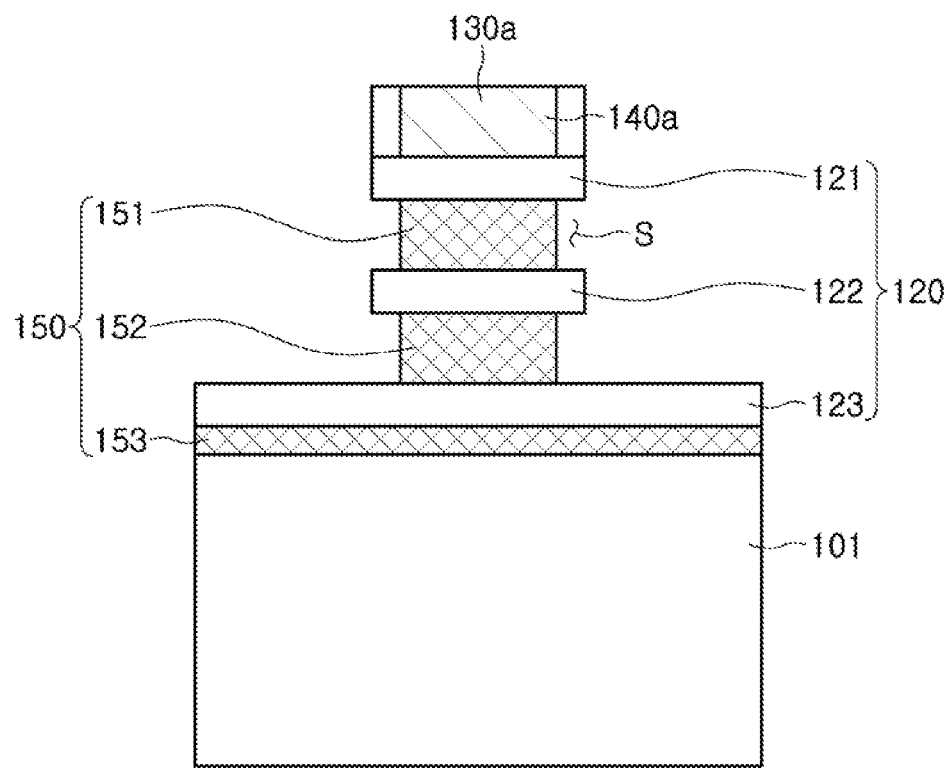
Figure 24:
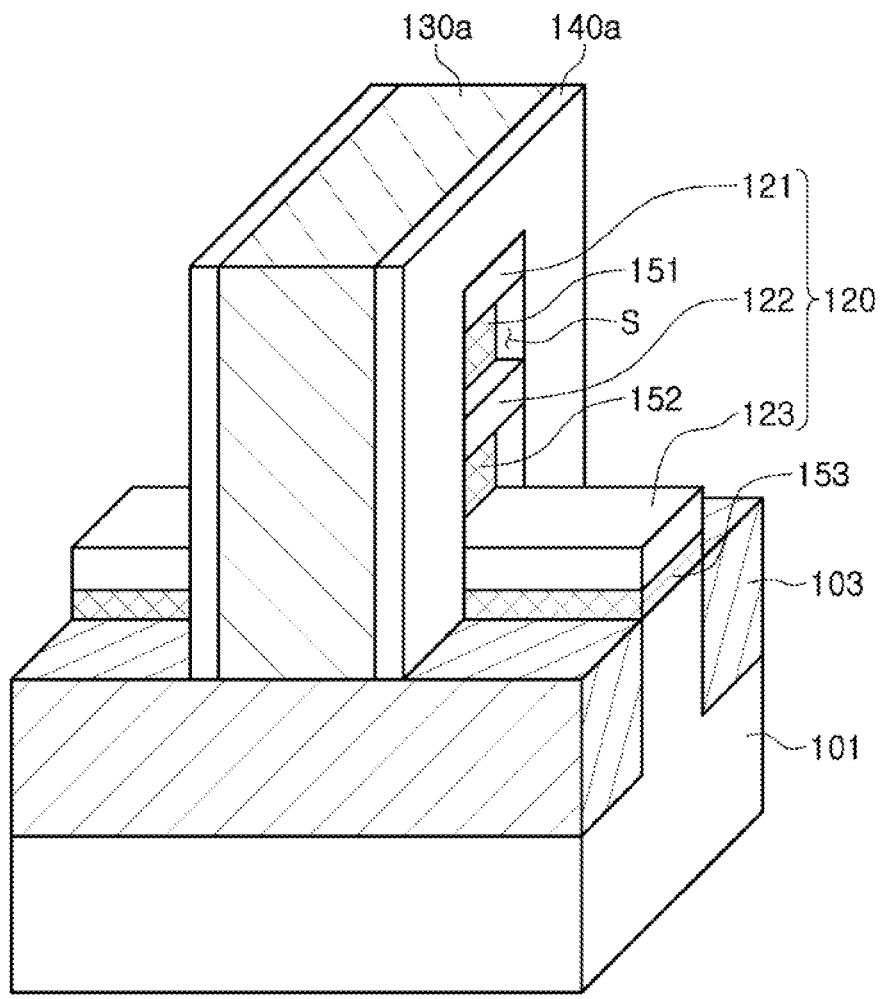

With reference to FIGS. 22 to 24, spacer spaces S may be formed by removing portions of the first sacrificial layer 151 and the second sacrificial layer 152 exposed on sides of the dummy gate electrode 130a and the first spacers 140a. As illustrated in FIGS. 23 and 24, at least portions of the first sacrificial layer 151 and the second sacrificial layer 152 are removed to form the spacer spaces S. In this case, a depth of each of the spacer spaces S may be substantially equal to a thickness of the first spacers 140a. For example, the depth of each of the spacer spaces S may be around 10 nm.

Figure 25:
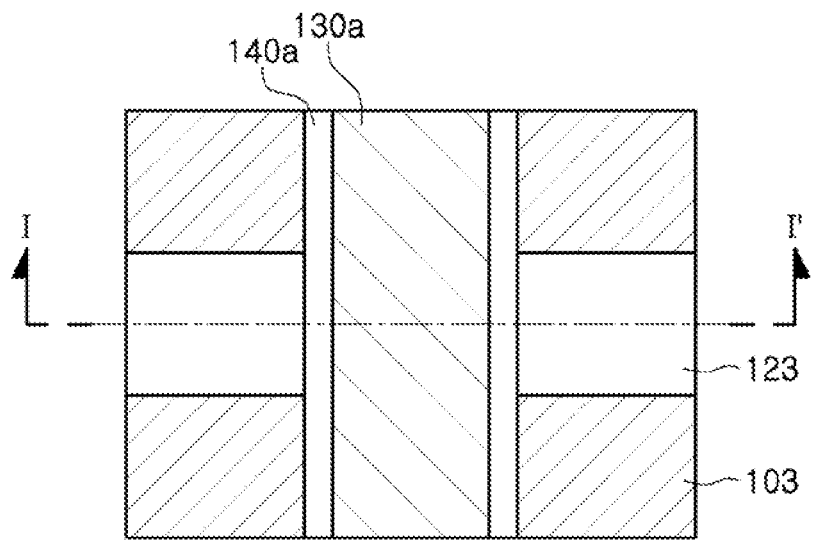
Figure 26:
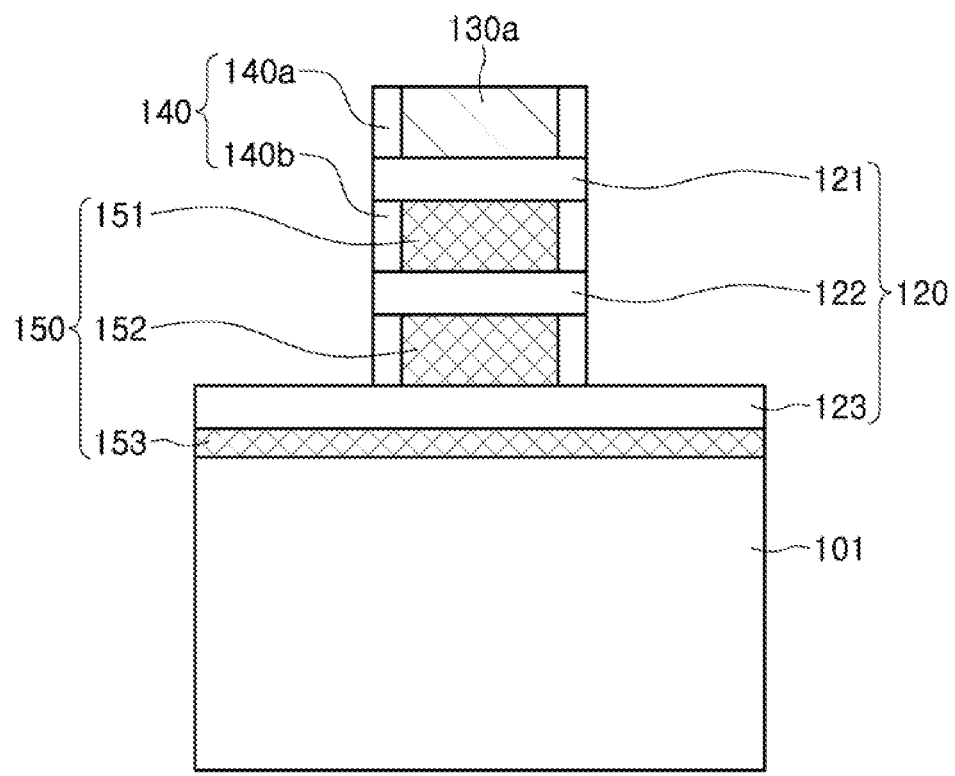
Figure 27:
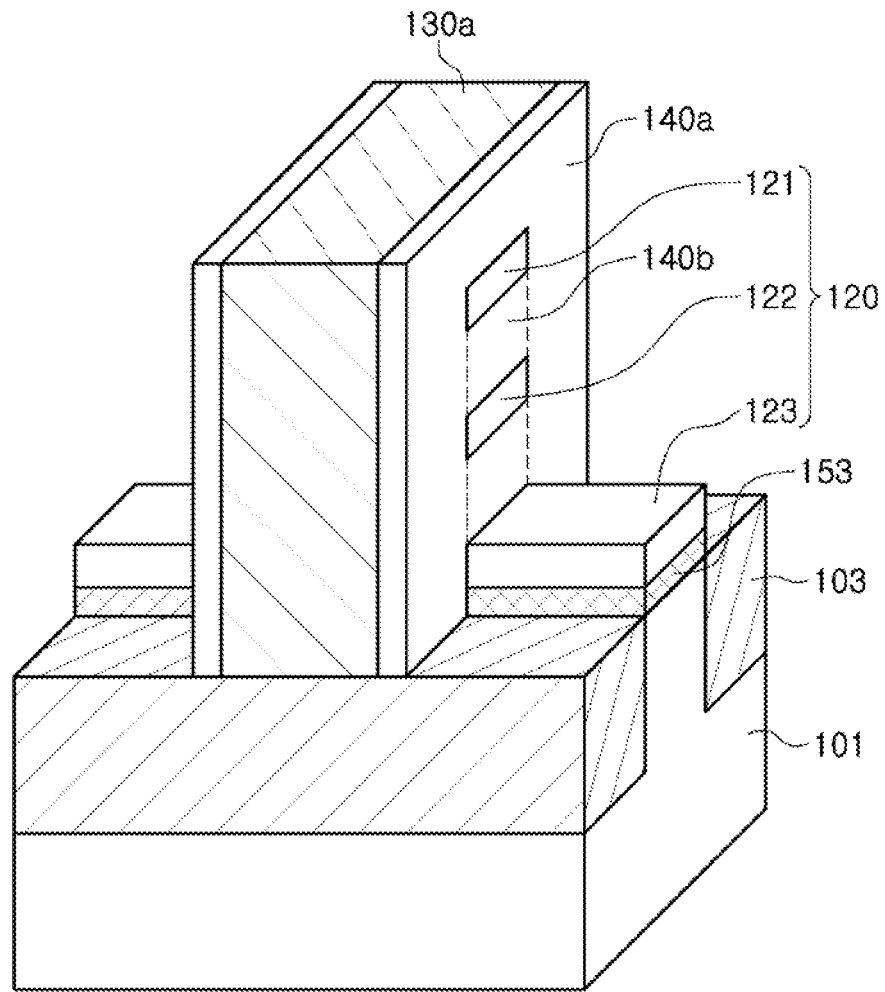

With reference to FIGS. 25 to 27, second spacers 140b may be formed by filling each of the spacer spaces S with an insulating material. A thickness of each of the second spacers 140b may be substantially equal to that of the first spacers 140a. In addition, the first spacers 140a and the second spacers 140b may be provided as the spacers 140 surrounding the gate electrode that will be subsequently formed. The second spacers 140b may be formed of the same material as that of the first spacers 140a. In an exemplary embodiment of the inventive concept, the first spacers 140a and the second spacers 140b may include $SiO_2$, $Si_3N_4$, or the like.

Figure 28:
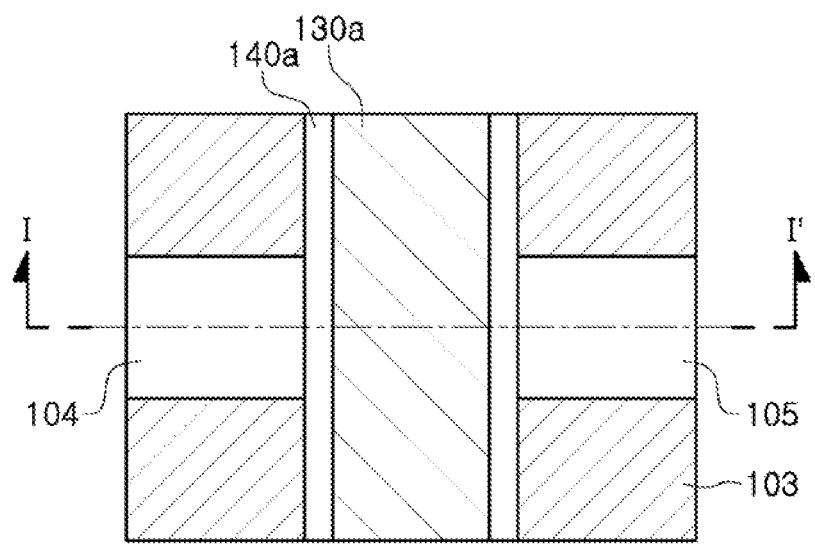
Figure 29:
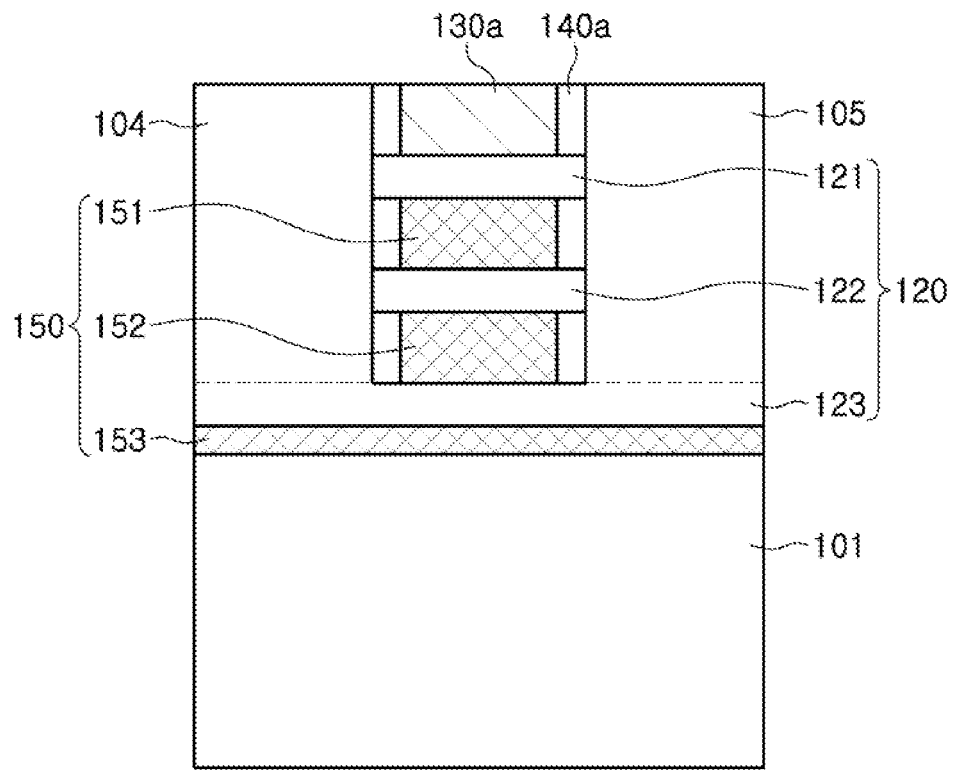
Figure 30:
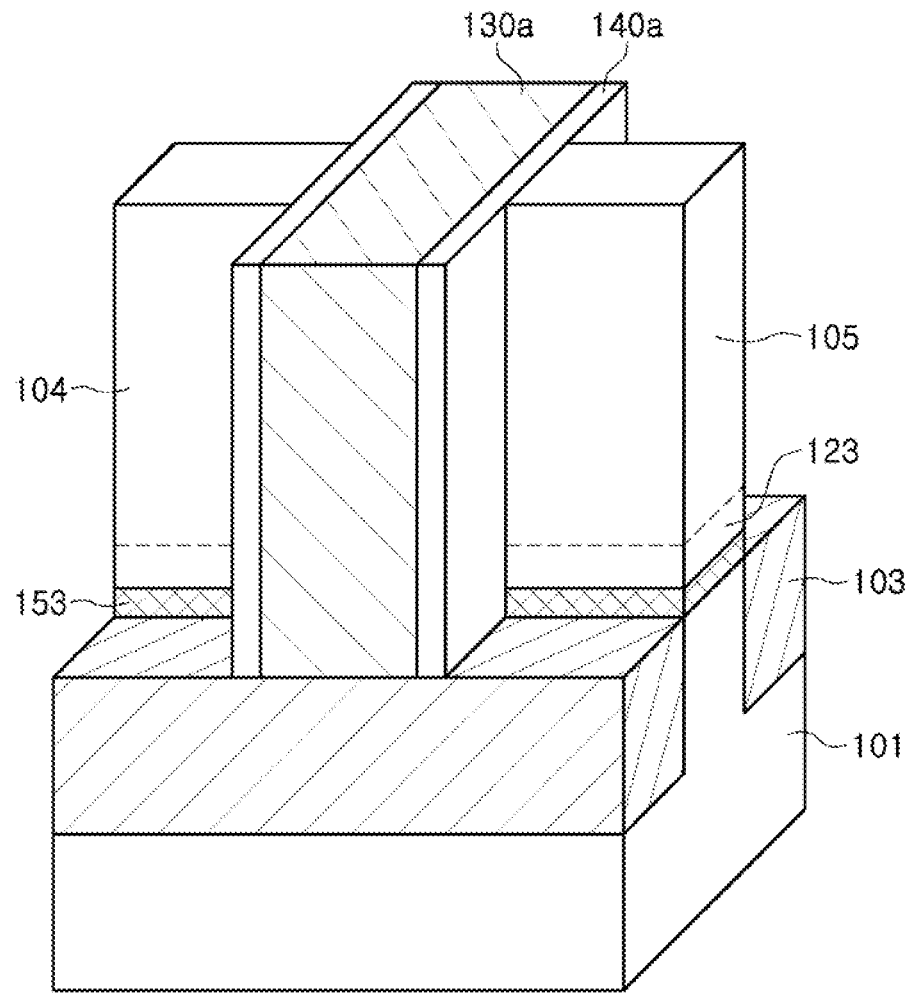

With reference to FIGS. 28 to 30, the source/drain regions 104 and 105 may be formed from the third nanosheet 123 using a selective epitaxial growth (SEG). The source/drain regions 104 and 105 may include a semiconductor material doped with a predetermined impurity. Upper surfaces of the source/drain regions 104 and 105 may be coplanar with those of the dummy gate electrode 130a and the first spacers 140a.

Figure 31:
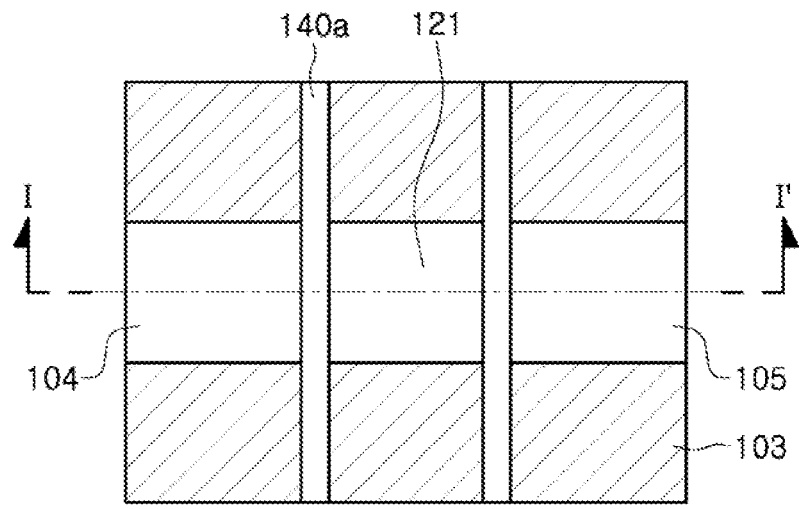
Figure 32:
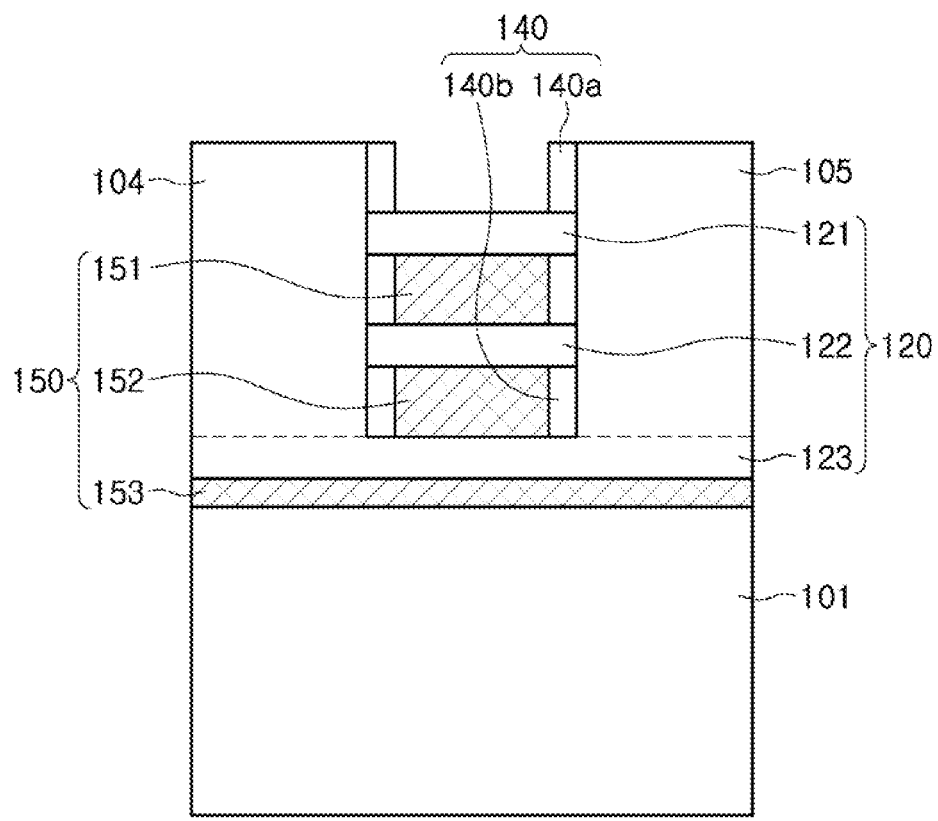
Figure 33:
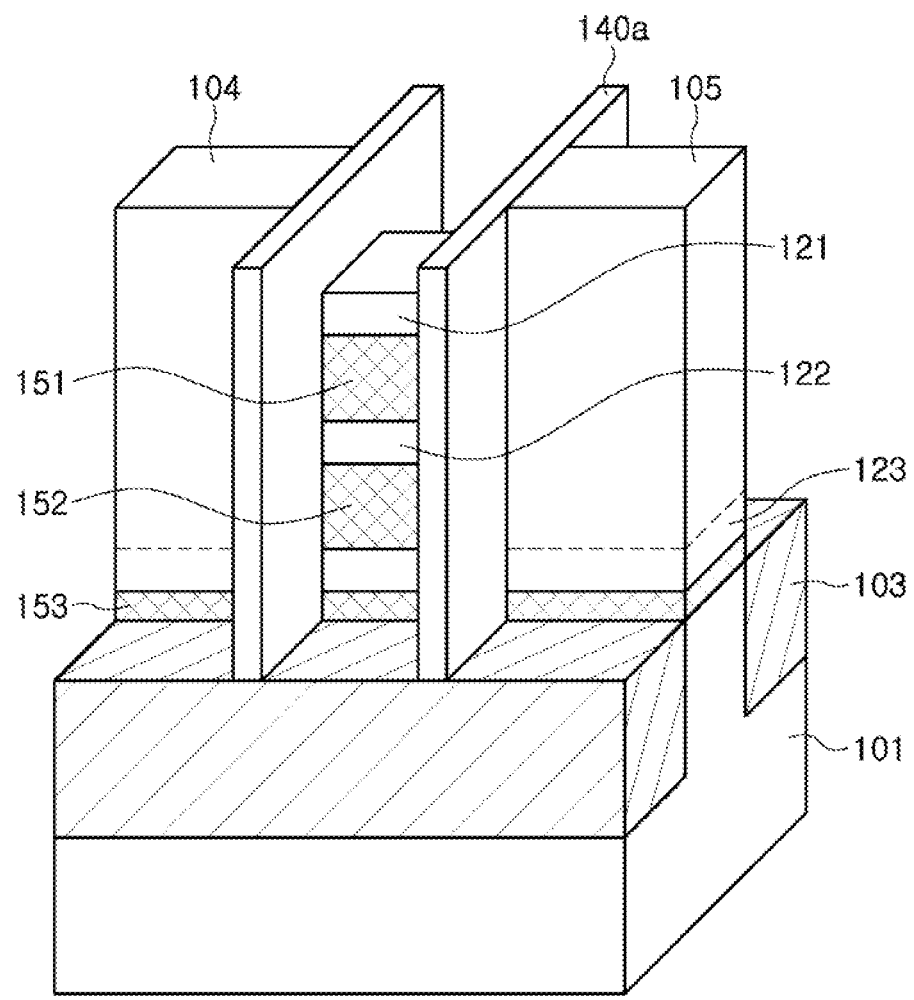
Figure 33:
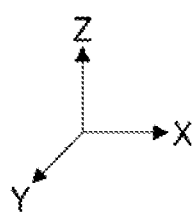

Subsequently, with reference to FIGS. 31 to 33, the dummy gate electrode 130a may be removed. The dummy gate electrode 130a may be selectively removed based on an etching selectivity of the dummy gate electrode 130a with respect to the first spacers 140a and the source/drain regions 104 and 105. The first to third nanosheets 121 to 123 (nanosheets 120) and the sacrificial layers 151 to 153 (sacrificial layers 150) may be exposed externally from a space between the first spacers 140a by removing the dummy gate electrode 130a.

Figure 34:
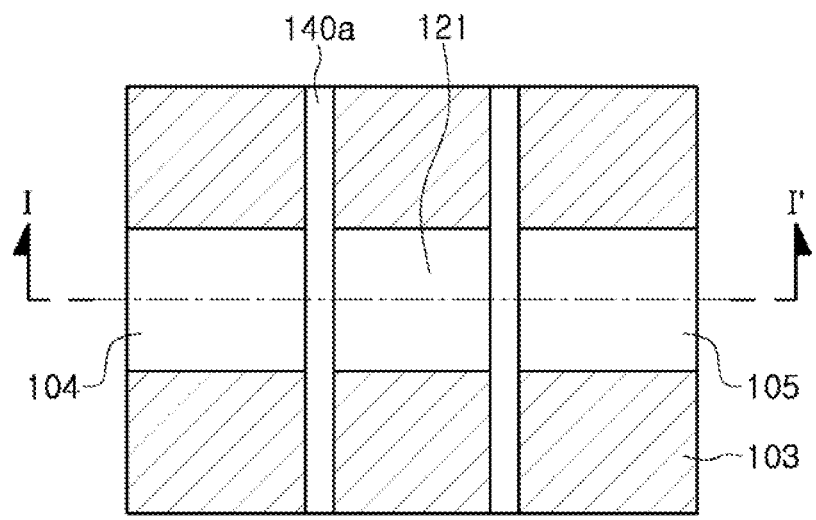
Figure 35:
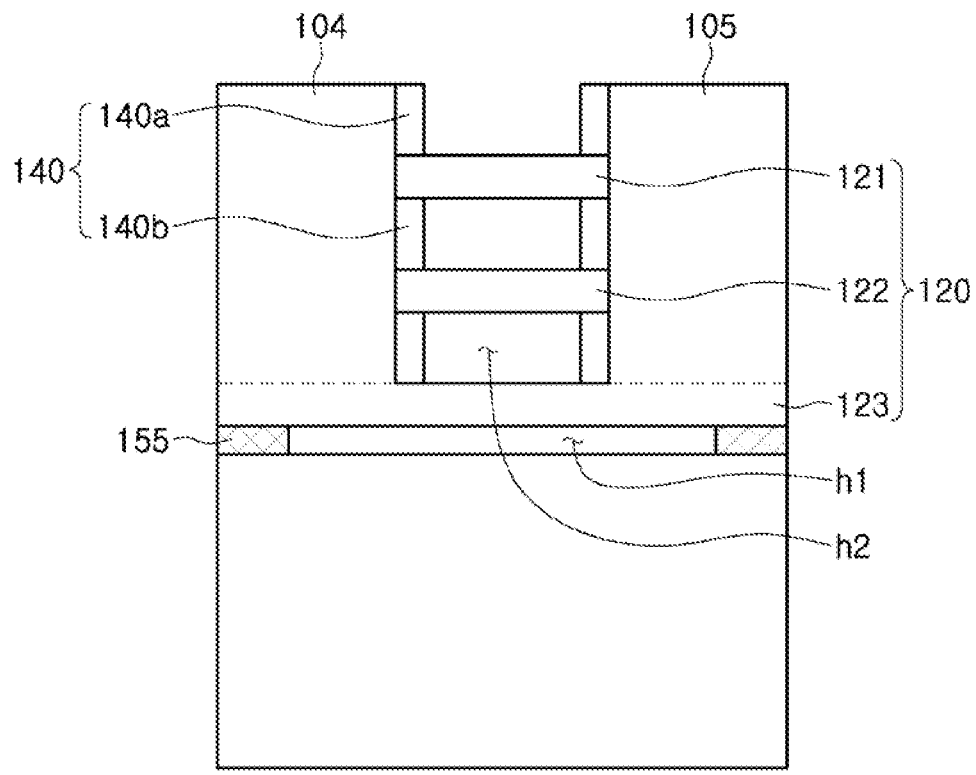
Figure 36:
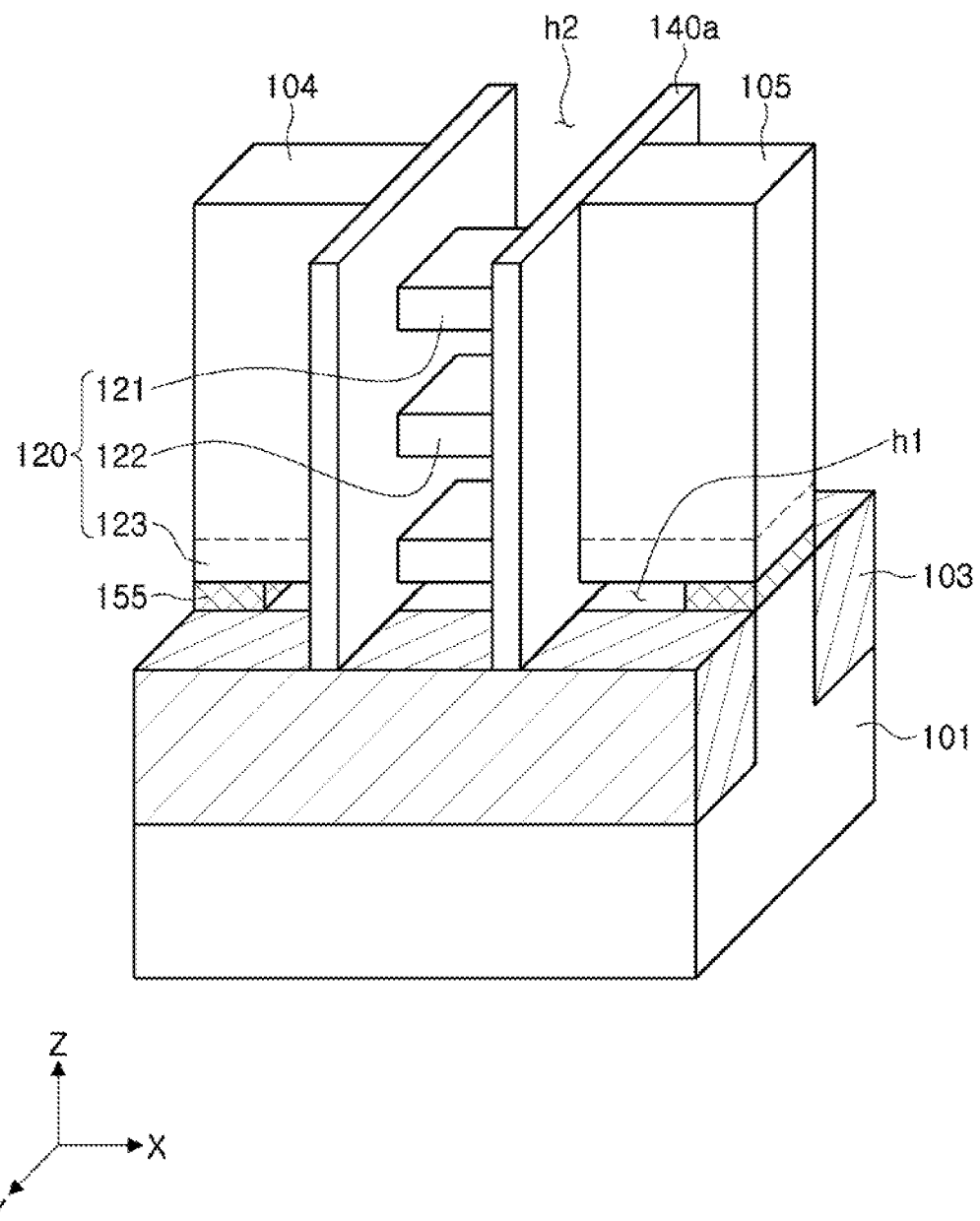

With reference to FIGS. 34 to 36, a first horizontal opening h1 and a second horizontal opening h2 may be formed by removing the sacrificial layers 151 to 153 selectively. As illustrated above, the sacrificial layers 151 to 153 may include a material different from the nanosheets 120, such as a material having a predetermined etching selectivity with respect to a material included in the nanosheets 120. In an exemplary embodiment of the inventive concept, the nanosheets 120 may include a semiconductor material, for example, Si, to provide a channel region of the semiconductor device 100, and the sacrificial layers 151 to 153 may include SiGe. In order to selectively remove exposed portions of the sacrificial layers 151 to 153 while not etching the nanosheets 120, an etchant having a significant etching selectivity of SiGe with respect to Si may be used. For example, an etchant including hydrogen peroxide ($H_2O_2$), hydrofluoric acid (HF), and acetic acid ($CH_3COOH$), an etchant including ammonium hydroxide ($NH_4OH$), hydrogen peroxide ($H_2O_2$), and deionized water ($H_2O$), and an etchant including peracetic acid, or a combination thereof, may be used to etch the sacrificial layers 151 to 153.

Concentrations of germanium included in the sacrificial layers 151 to 153 may be different from each other. The third sacrificial layer 153 may include a higher concentration of germanium than concentrations of germanium in the first sacrificial layer 151 and the second sacrificial layer 152. For example, when only the sacrificial layers 151 to 153 are selectively removed with the nanosheets 120 remaining in place, the third sacrificial layer 153 includes a higher concentration of germanium than germanium concentrations of the first sacrificial layer 151 and the second sacrificial layer 152. Thus, the third sacrificial layer 153 may be removed more rapidly than the first and second sacrificial layers 151 and 152.

Therefore, a length (in the direction of the x-axis in FIG. 36) of the first horizontal opening h1 formed by removing at least a portion of the third sacrificial layer 153 may be greater than that of the second horizontal opening h2 formed by removing the first sacrificial layer 151 and the second sacrificial layer 152. For example, when a length of the second horizontal opening h2 in a direction of the x-axis is in the range of tens of nanometers, the length of the first horizontal opening h1 in the direction of the x-axis may be greater than that of the second horizontal opening h2 by one to tens of nanometers. For example, when the length of the second horizontal opening h2 in the direction of the x-axis is around 25 nm, the length of the first horizontal opening h1 in the direction of the x-axis may be greater than that of the second horizontal opening h2 by around 3 nm to around 40 nm.

In an exemplary embodiment of the inventive concept, the length of the first horizontal opening h1 may be greater than that of the first nanosheet 121 and the second nanosheet 122 in the x-axis direction, respectively. In addition, the length, in the x-axis direction, of the residual sacrificial layer 155 provided by the third sacrificial layer 153, which is not removed, may be less than that of the source/drain regions 104 and 105. Therefore, since a voltage supplied to the source/drain regions 104 and 105 causes a leakage path formed in the substrate 101 to increase in length, current transfer through the leakage path may be efficiently suppressed.

Figure 37:
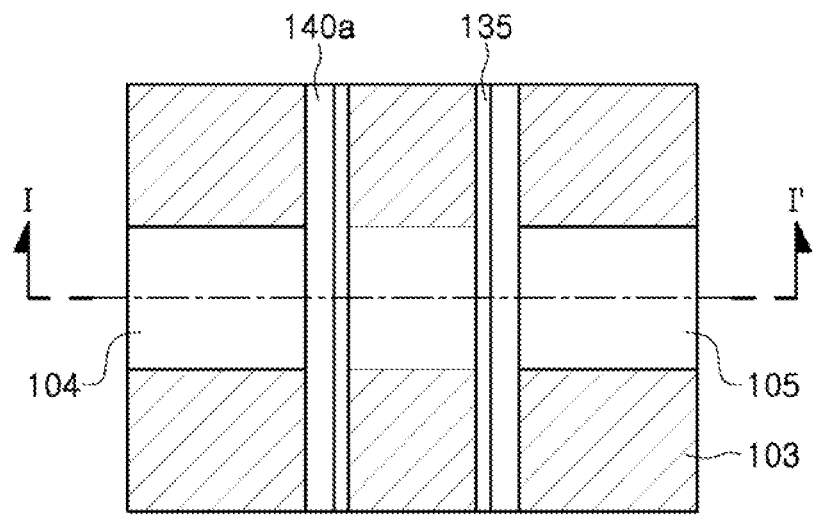
Figure 38:
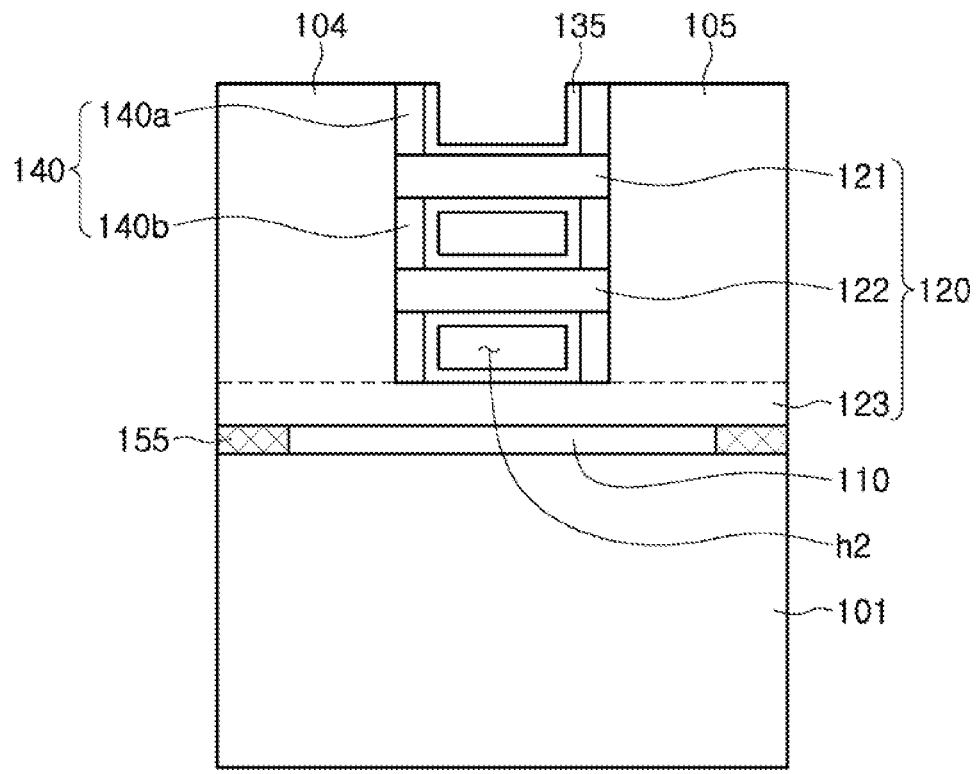
Figure 39:
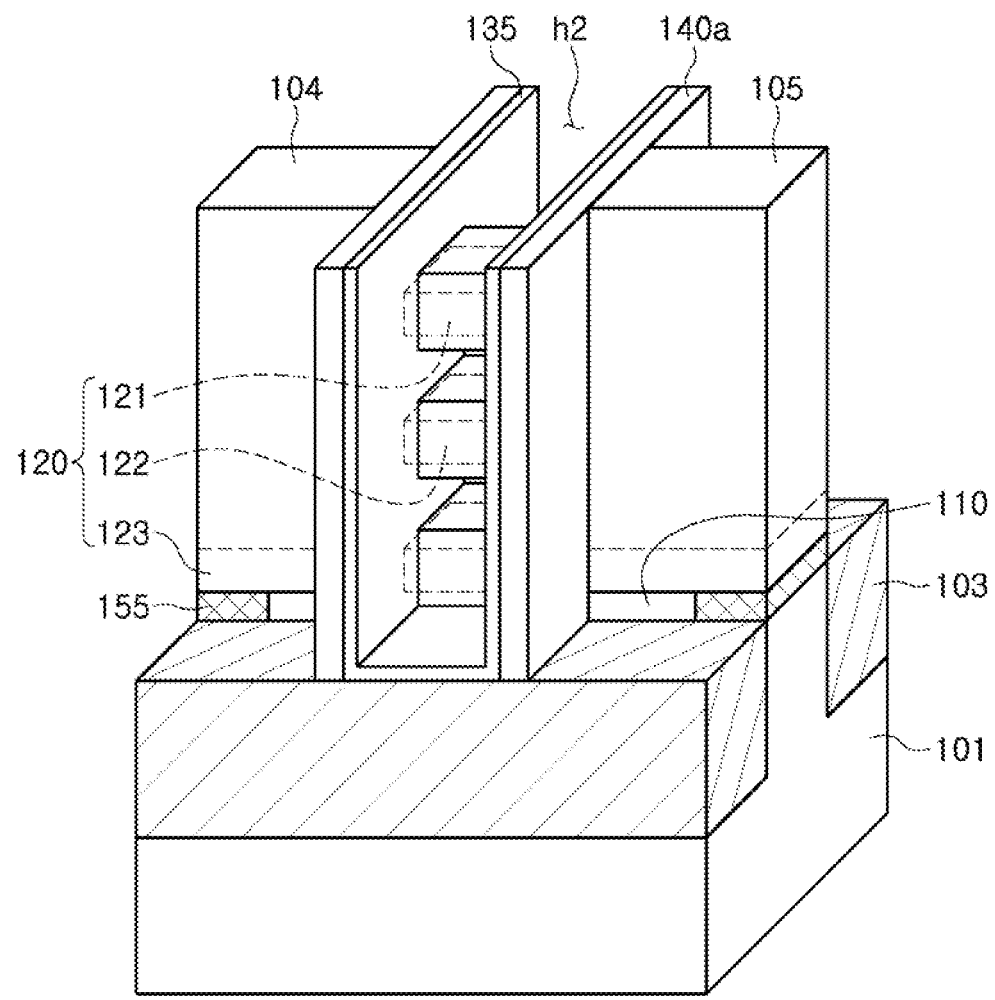

With reference to FIGS. 37 to 39, the gate insulating layer 135 may be formed within the first horizontal opening h1 and the second horizontal opening h2. The gate insulating layer 135 formed within the horizontal openings h1 and h2 may include first and second insulating materials having different permittivities. For example, the gate insulating layer 135 may include the first insulating layer formed of the first insulating material and the second insluting layer formed of the second insulating material having a higher permittivity than that of the first insulating material. The first insulating layer may be disposed closer to the first spacers 140a and the nanosheets 120 than the second insulating layer disposed thereto. Thus, the first insulating layer may be formed before formation of the second insulating layer.

The gate insluting layer 135 may be formed through a process, such as atomic layer deposition (ALD), chemical vapor deposition (CVD), or the like. The first insulating layer, formed before the second insulating layer, may be disposed relatively close to the first spacers 140a, the nanosheets 120, and the like. In an exemplary embodiment of the inventive concept, the first insulating layer may be formed to have a thickness smaller than that of the second insulating layer. For example, the thickness of the first insulating layer may be around 0.7 nm, and a thickness of the second insulating layer may be around 1.7 nm. The thickness of the gate insulating layer 135 may be around 2.4 nm.

With reference to FIGS. 38 and 39, the first horizontal opening h1 may be completely filled with the gate insulating layer 135. In order to fill the first horizontal opening h1 with the gate insulating layer 135, a height of the first horizontal opening h1 may be equal to twice the thickness of the gate insulating layer 135, or less than twice the thickness of the gate insulating layer 135. In a process illustrated in FIGS. 10 and 11, since the thickness of the third sacrificial layer 153S is equal to twice or less than twice the thickness of the gate insulating layer 135, the height of the first horizontal opening h1 may be limited to the thickness of the third sacrificial layer 153S. In the example above, when the thickness of the gate insulating layer 135 is around 2.4 nm, the height of the first horizontal opening h1 may be around 5 nm or less. The second horizontal opening h2 might not be completely filled with the gate insulating layer 135 because the height of the space between the nanosheets 120 is greater than twice the thickness of the gate insulating layer 135.

The first horizontal opening h1 filled with the gate insulating layer 135 may be provided as the planar insulating layer 110. In the planar insulating layer 110, the first insulting layer 111 and the second insulting layer 112 may be disposed in the structure illustrated in FIGS. 4A and 4B. The second insulating layer 112 may include a material having a higher level of permittivity than that of the first insulating layer 111.

Figure 40:
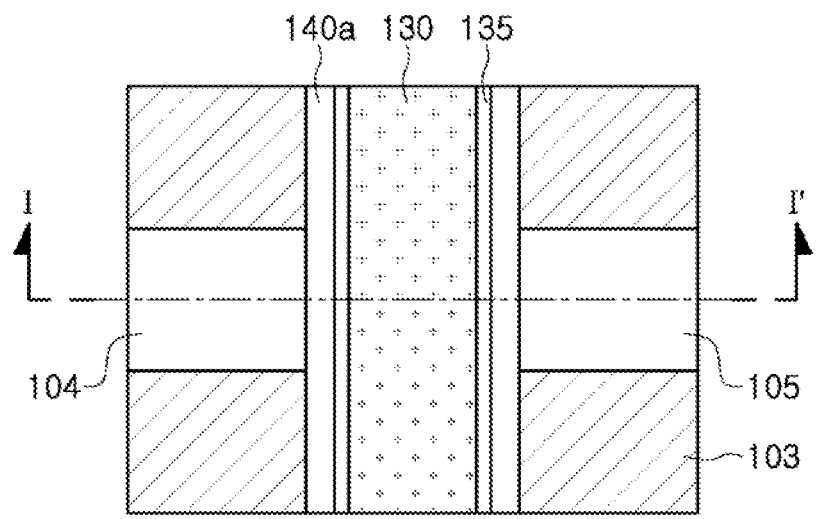
Figure 41:
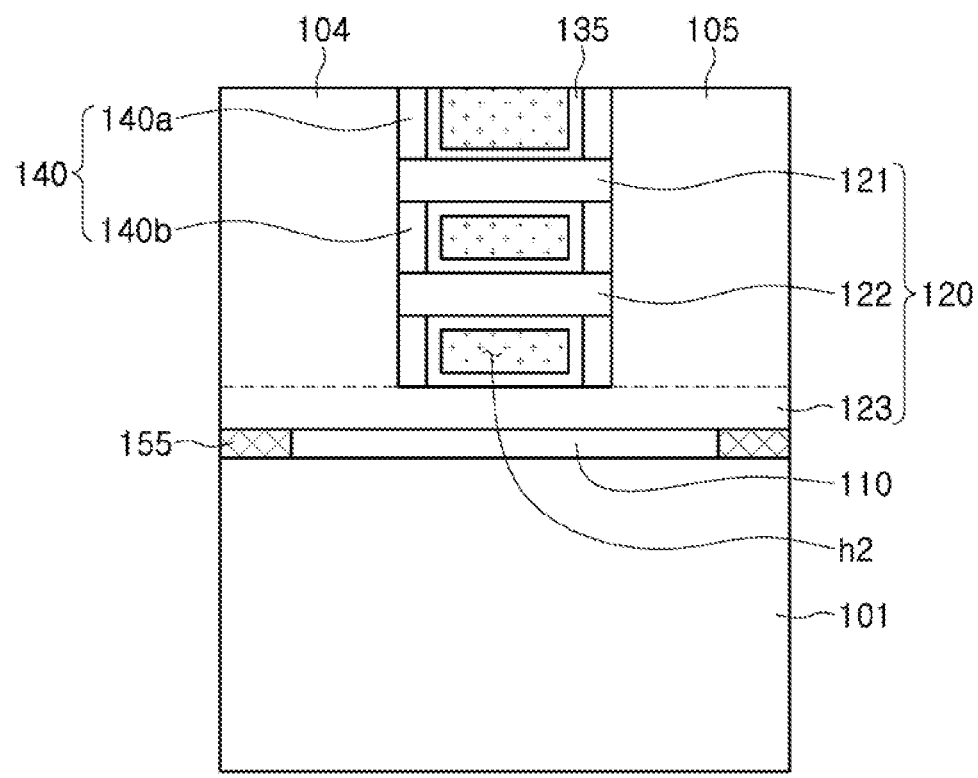
Figure 42:
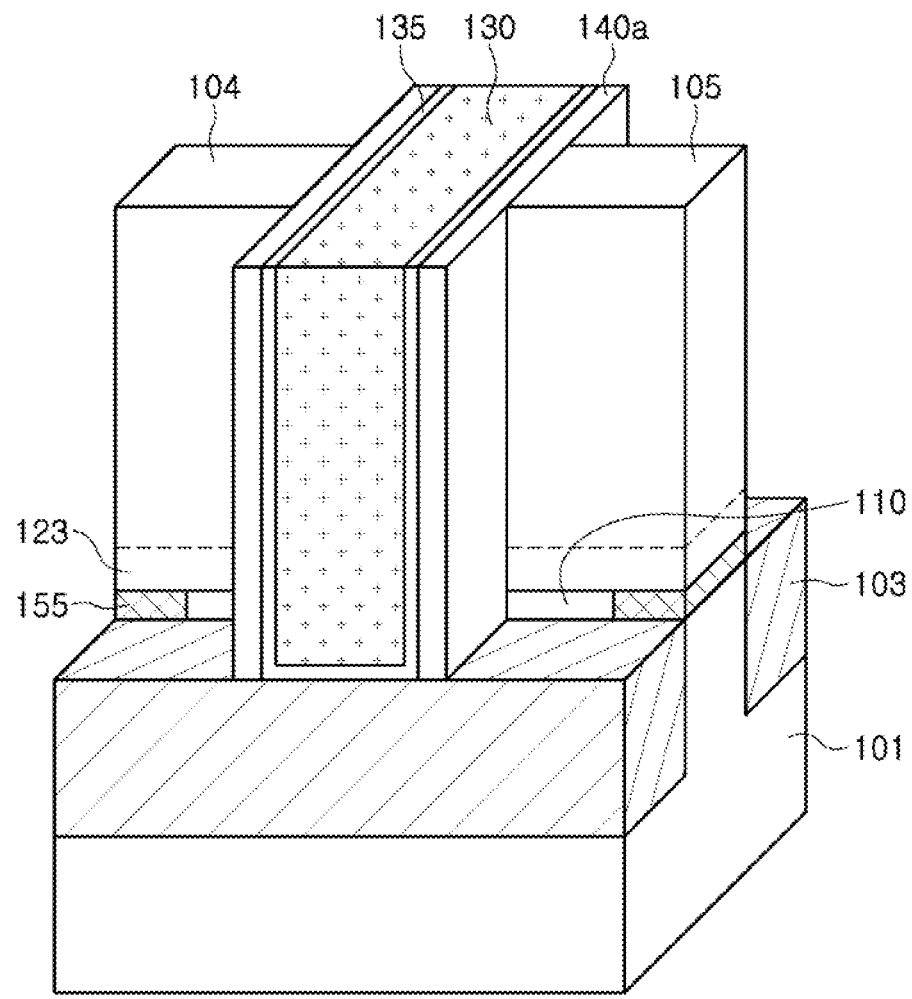

With reference to FIGS. 40 to 42, the gate electrode 130 may be formed by filling the second horizontal opening h2 with a conductive material, such as a metal, metal silicide, polysilicon, or the like. The gate insulating layer 135 is disposed between the gate electrode 130 and the nanosheets 120. In addition, portions of the nanosheets 120 adjacent to the gate electrode 130 may include the channel regions.

In a process of manufacturing the semiconductor device 100, as illustrated in FIGS. 10 and 11, the plurality of sacrificial layers 150S and the plurality of semiconductor layers 120S may be stacked on the substrate 101. In an exemplary embodiment of the inventive concept, the third sacrificial layer 153S, among the plurality of sacrificial layers 150S, disposed closest to the substrate 101 may have physical properties such as a higher etching rate than those of the first sacrificial layer 151S and the second sacrificial layer 152S. In addition, the thickness of the third sacrificial layer 153S may be less than that of the first sacrificial layer 151S and the second sacrificial layer 152S, respectively. The thickness of the third sacrificial layer 153S may be equal to twice or less than twice the thickness of the gate insulating layer 135 to be formed in a subsequent process.

When the plurality of sacrificial layers 150S is formed, the length and other dimensions of the planar insulating layer 110, formed in a subsequent process, may be adjusted by defining characteristics of the third sacrificial layer 153S. The characteristics of the third sacrificial layer 153S that may be defined include, for example, physical properties and the thickness of the third sacrificial layer 153S. By limiting the length of the third sacrificial layer 153S to being twice or less than twice that of the gate insulating layer 135, the planar insulating layer 110 may be formed in conjunction with the gate insulating layer 135. In addition, the length of the first horizontal opening h1 may be increased or decreased by controlling the physical properties of the third sacrificial layer 153S, such as concentrations of germanium included therein. As a result, the length of the planar insulating layer 110 may be adjusted.

FIGS. 43 to 48 are drawings illustrating a method of manufacturing the semiconductor device illustrated in FIG. 7, according to an exemplary embodiment of the inventive concept.

Figure 43:
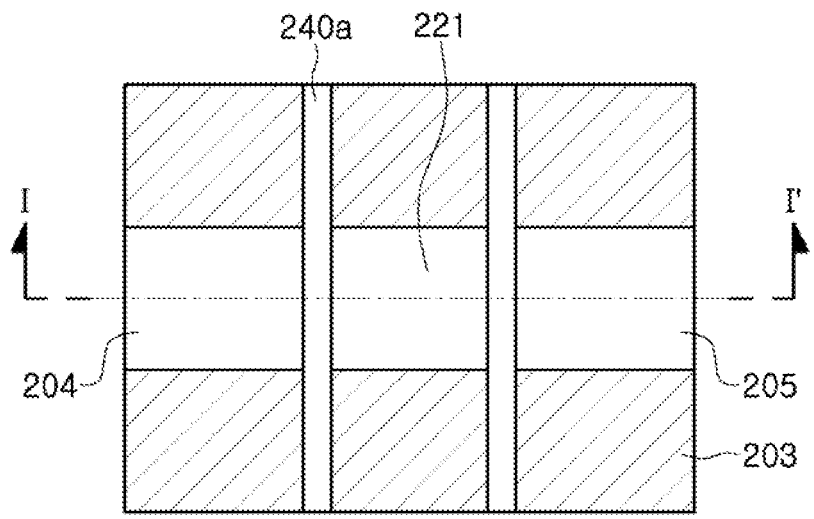
FIGS. 43 to 48 are drawings illustrating a method of manufacturing the semiconductor device illustrated in FIG. 7, according to an exemplary embodiment of the inventive concept.
Figure 44:
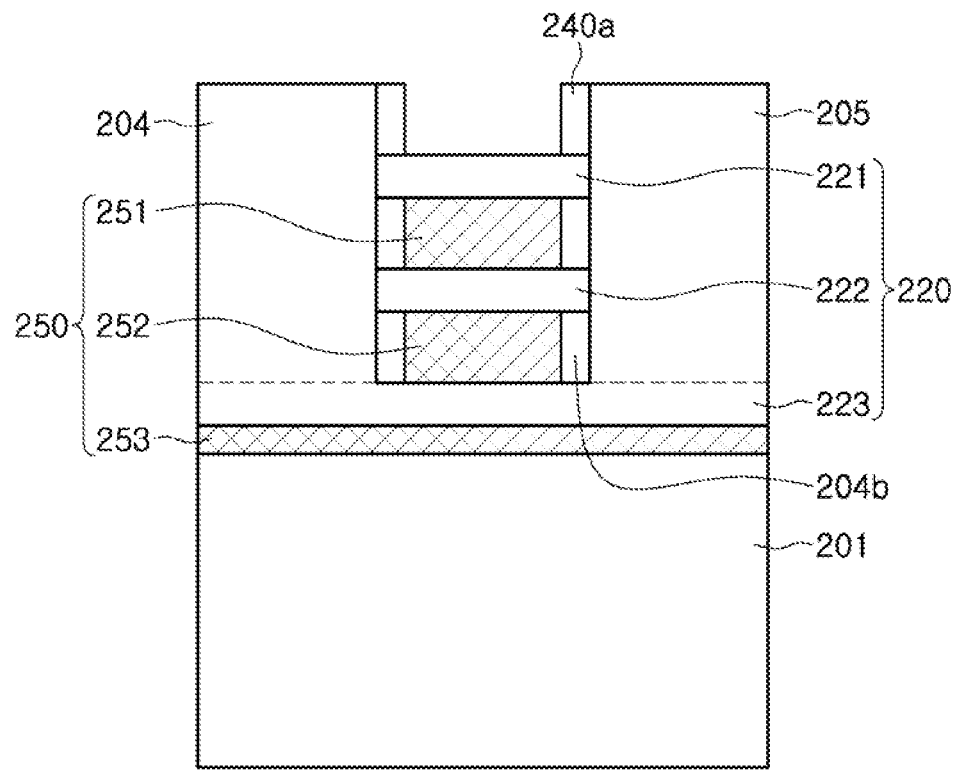
Figure 45:
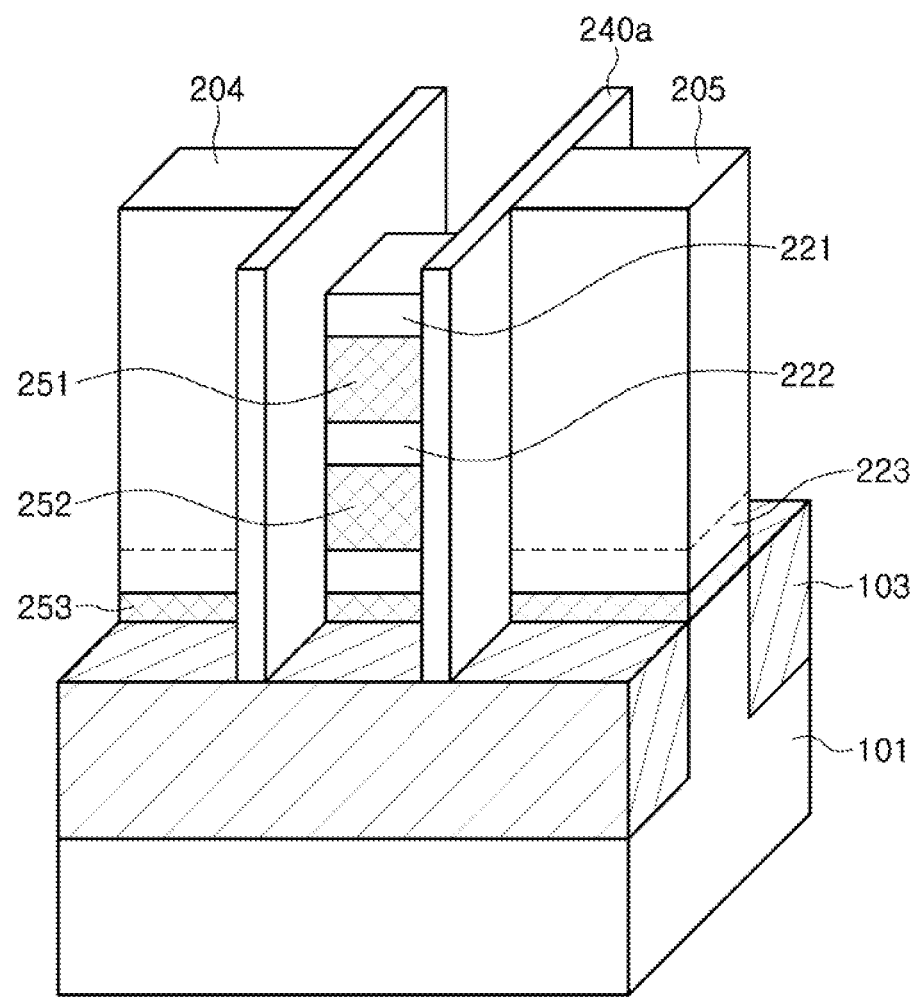

With reference to FIGS. 43 to 45, in a method of manufacturing the semiconductor device 200, according to an exemplary embodiment of the inventive concept, the plurality of sacrificial layers 251 to 253 (sacrificial layers 250) and the plurality of nanosheets 221 to 223 (nanosheets 220) are alternately stacked on the substrate 201, and the source/drain regions 204 and 205 may be disposed on the third nanosheet 223. On surfaces of the source/drain regions 204 and 205, for example, on surfaces of the source/drain 204 and 205 that face each other, first spacers 240a are disposed. Exterior surfaces of the nanosheets 220 and the sacrificial layers 250 may be exposed between the first spacers 240a.

As described above, the sacrificial layers 250 and the nanosheets 220 may include a material having a predetermined etching selectivity. For example, the sacrificial layers 250 may include SiGe, and the nanosheets 220 may include Si. In addition, the third sacrificial layer 253, among the sacrificial layers 250, which is disposed closest to the substrate 201, may have a higher concentration of germanium than that of the first sacrificial layer 251 and the second sacrificial layer 252. In detail, the concentration of germanium included in the third sacrificial layer 253, in the exemplary embodiment of the inventive concept illustrated with reference to FIGS. 43 to 48, may be higher than that of the third sacrificial layer 153 described in the exemplary embodiment of the inventive concept illustrated with reference to FIGS. 10 to 42. Therefore, an etching rate of the third sacrificial layer 253 described with reference to FIGS. 43 to 48 may be higher than that of the third sacrificial layer 153 described with reference to FIGS. 10 to 42.

Figure 46:
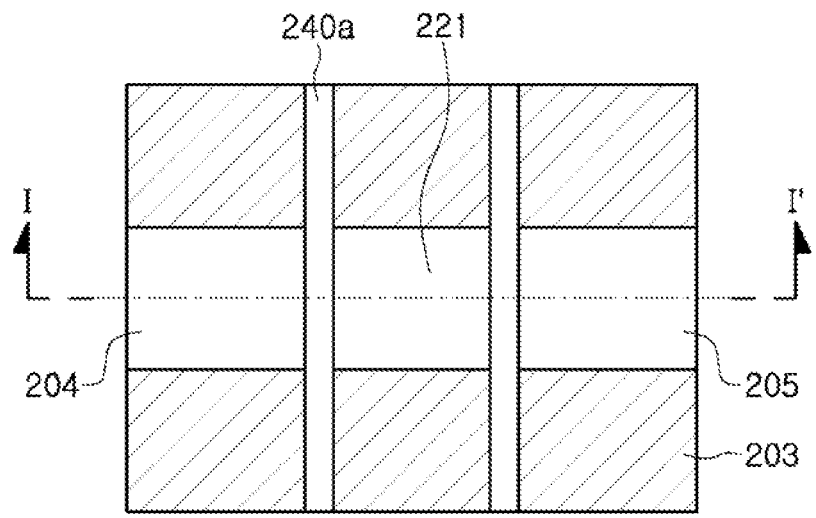
Figure 47:
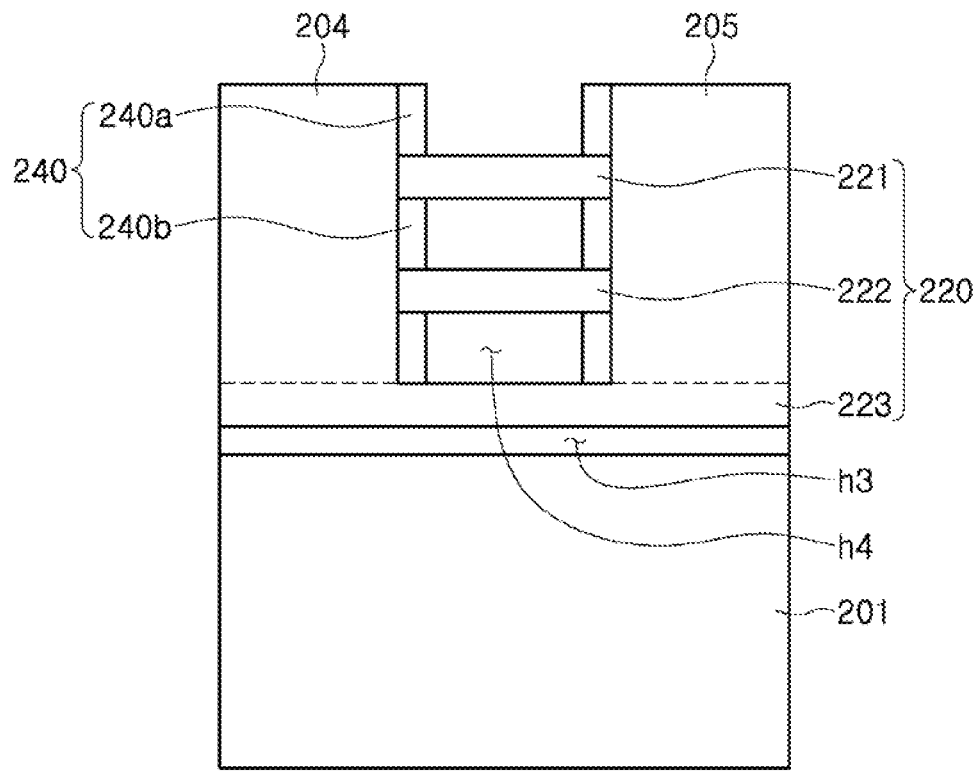
Figure 48:
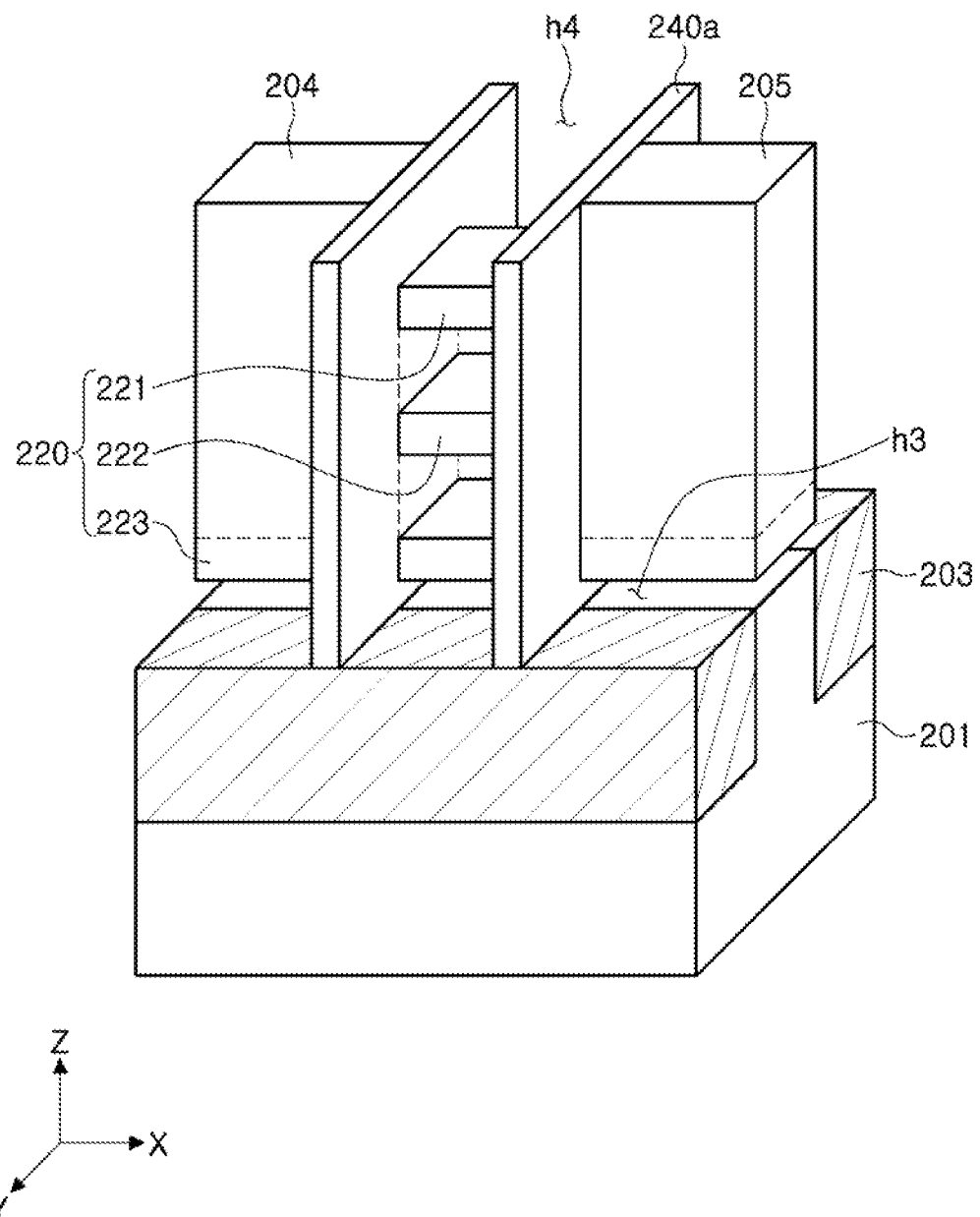

With reference to FIGS. 46 to 48, in a process of selectively removing the sacrificial layers 250 while allowing the nanosheets 220 to remain in place, the third sacrificial layer 253 may be entirely removed due to the high concentration of germanium included in the third sacrificial layer 253. A structure illustrated in FIGS. 46 to 48 a first horizontal opening h3 may be formed between the source/drain 204 and 205 and the substrate 201. In addition, a second horizontal opening h4 may be formed between the first spacers 240a. The source/drain 204 and 205 may be physically supported by the first spacers 240a. In a subsequent process of forming the gate insulating layer 235, the first horizontal opening h3 may be filled with an insulating material the same as that of the gate insulating layer 235. Thus, unlike as shown FIGS. 10 to 42, the residual sacrificial layer 155 might not be formed in a semiconductor device, according to an exemplary embodiment of the inventive concept.

FIGS. 49 to 54 are drawings illustrating a method of manufacturing the semiconductor device illustrated in FIG. 8, according to an exemplary embodiment of the inventive concept.

Figure 49:
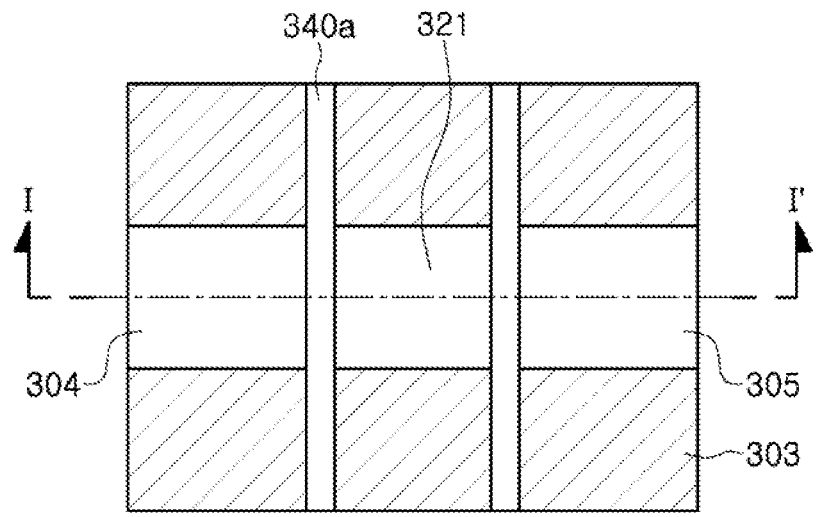
FIGS. 49 to 54 are drawings illustrating a method of manufacturing the semiconductor device illustrated in FIG. 8, according to an exemplary embodiment of the inventive concept.
Figure 50:
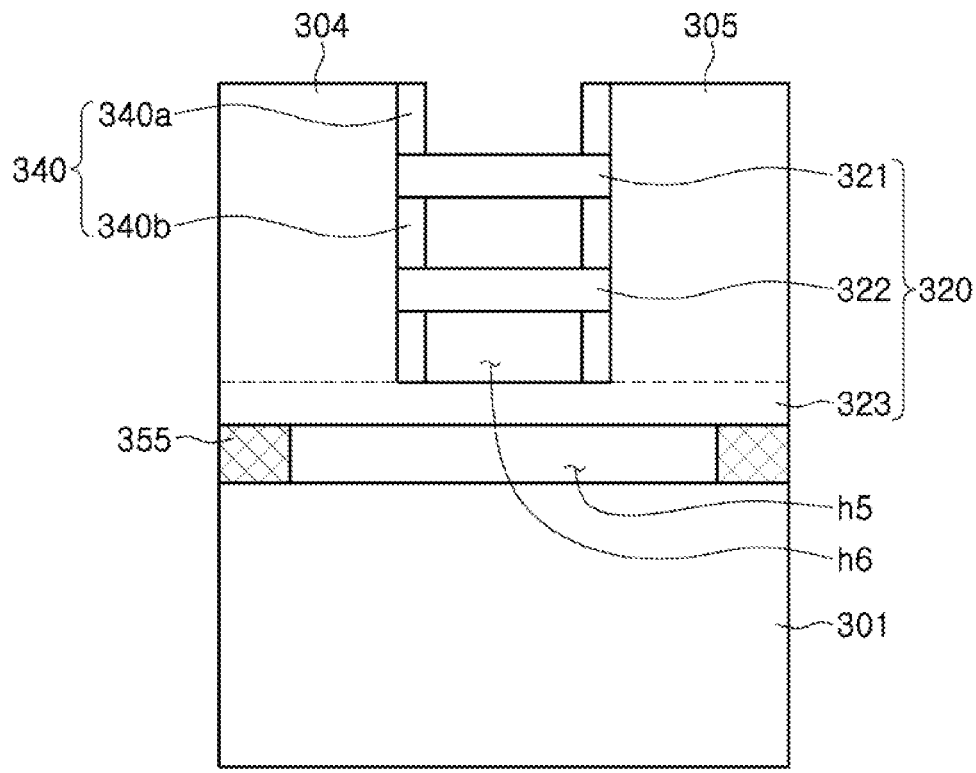
Figure 51:
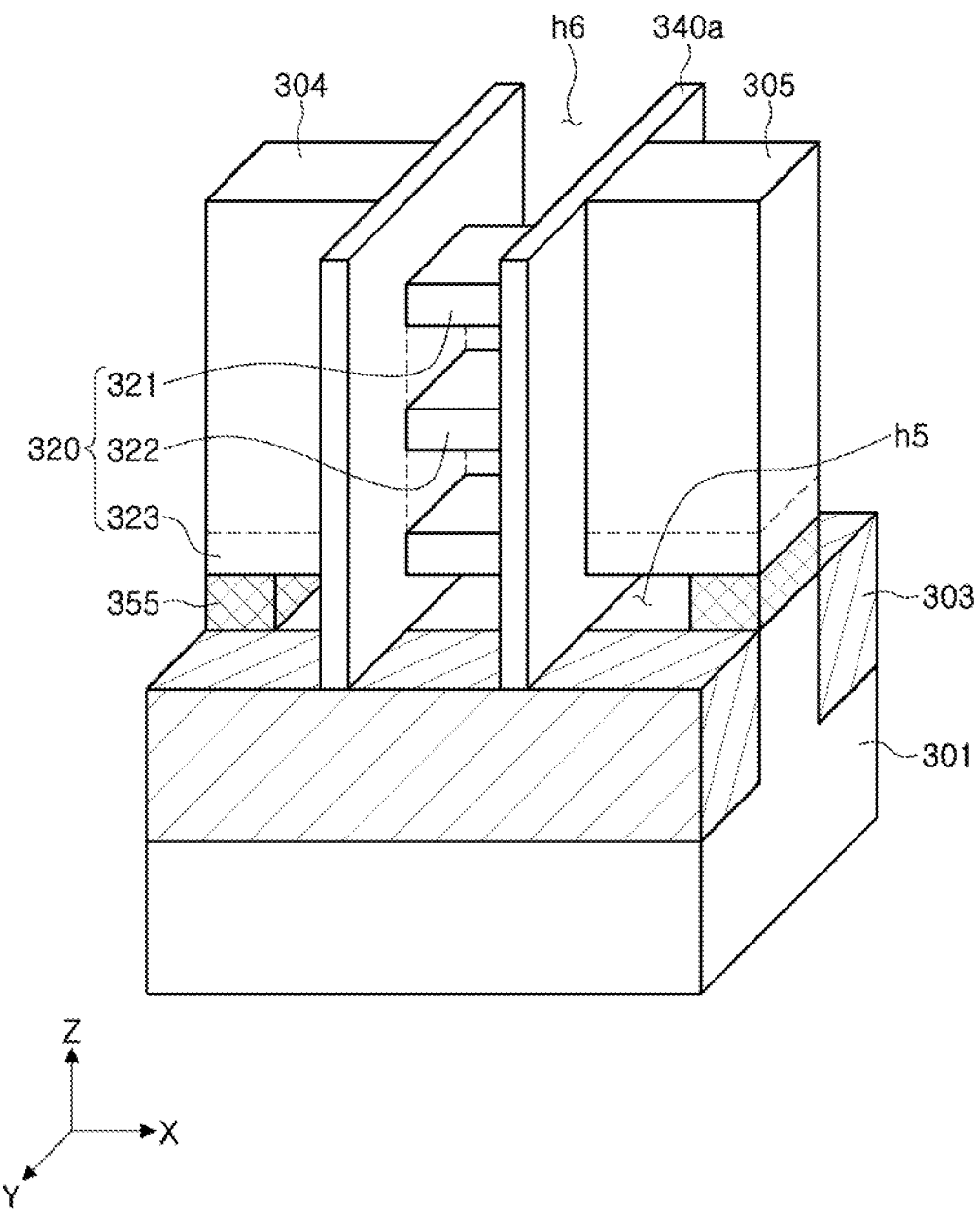

With reference to FIGS. 49 to 51, in a method of manufacturing the semiconductor device 300, according to an exemplary embodiment of the inventive concept, a plurality of sacrificial layers 351 to 353 (sacrificial layers 350) and the first to third nanosheets 321 to 323 (nanosheets 320) are alternately stacked on a substrate 301. The source/drain regions 304 and 305 may be disposed on the third nanosheet 323. On surfaces of the source/drain regions 304 and 305, for example, on surfaces of the source/drain 304 and 305 that face each other, first spacers 340a are disposed. Exterior surfaces of the nanosheets 320 and a sacrificial layer 350 may be exposed between the first spacers 340a.

The thickness of a first horizontal opening h5, illustrated in FIG. 51, may be greater than that of the first horizontal openings h1 and h3 formed described above. The first horizontal opening h5 having a relatively large thickness may be provided by forming a relatively thick third sacrificial layer 350, when stacking a plurality of sacrificial layers 350 and a plurality of nanosheets 320 to manufacture the semiconductor device 300.

Figure 52:
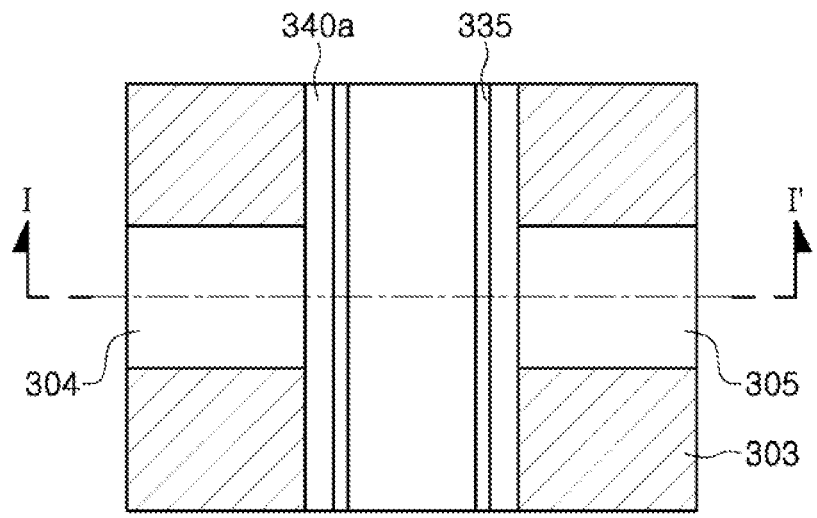
Figure 53:
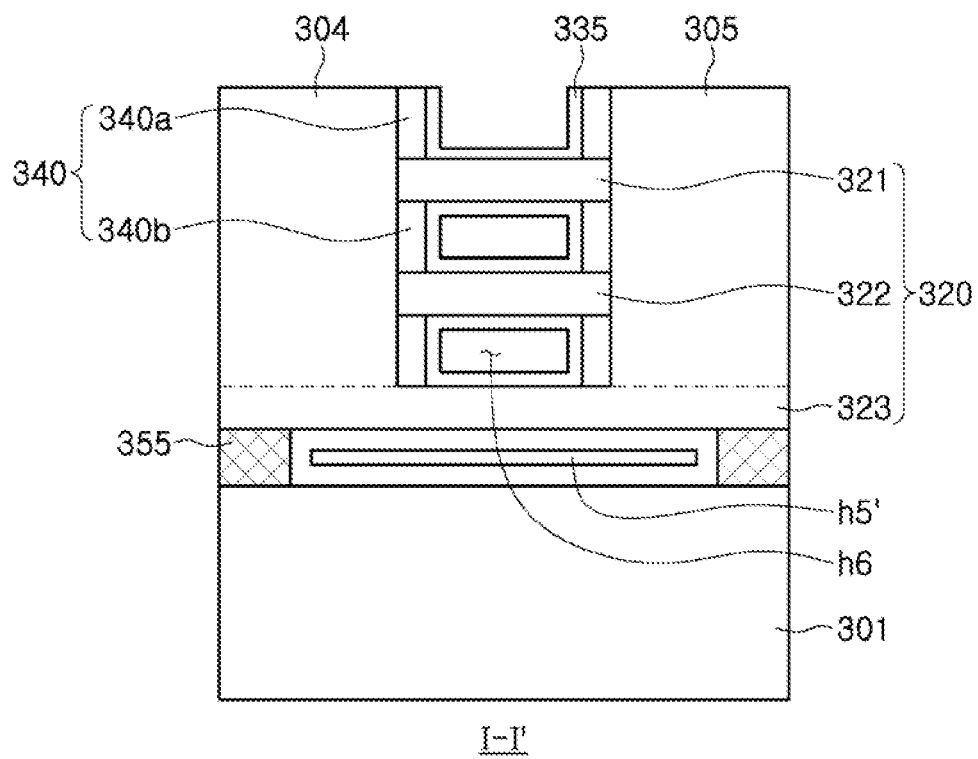
Figure 54:
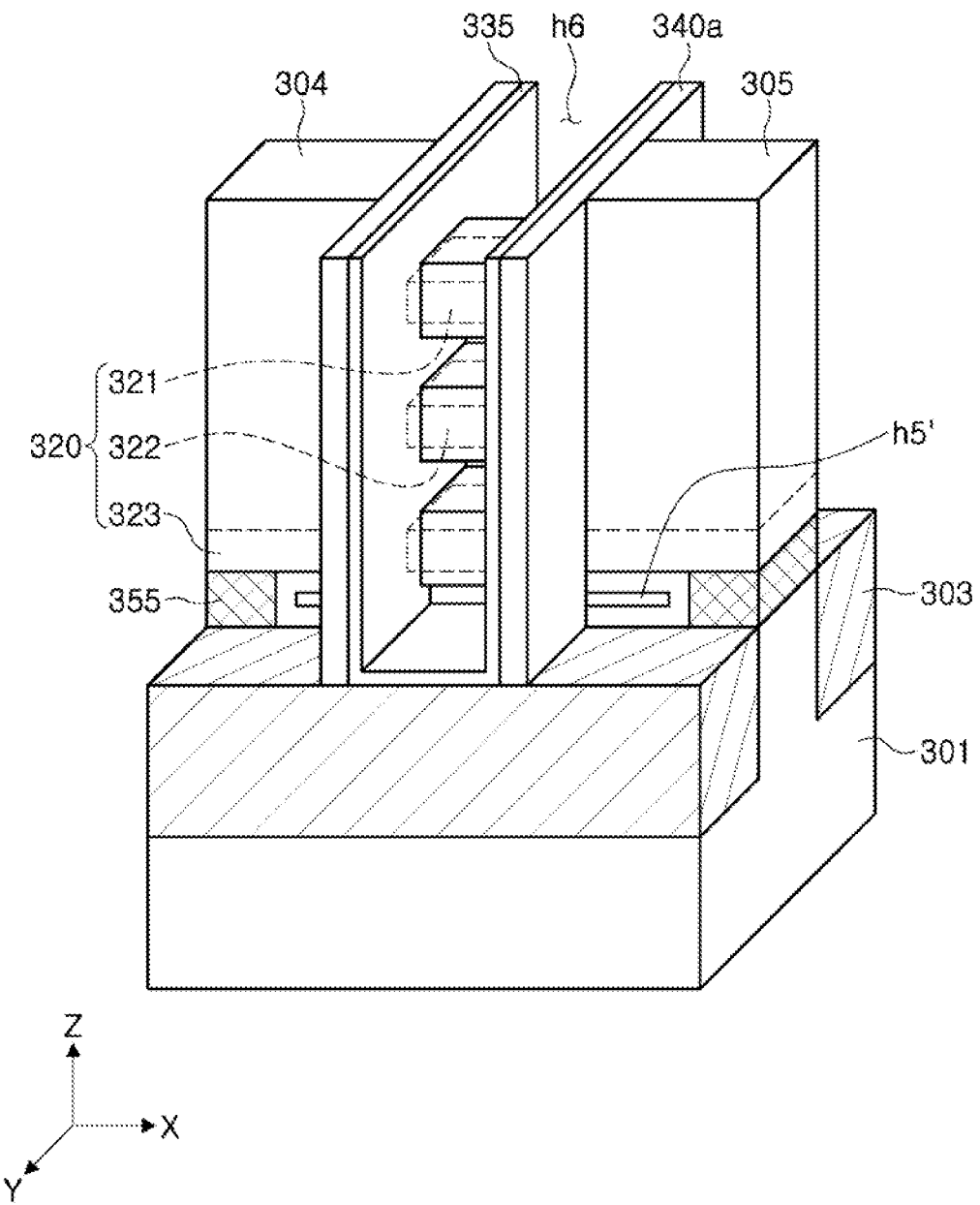

Subsequently, with reference to FIGS. 52 to 54, a gate insulating layer 335 may be formed by evaporating an insulating material in the first horizontal opening h5 and a second horizontal opening h6. In this case, a thickness of the first horizontal opening h5 may be more than twice the thickness of the gate insulating layer 335, and the first horizontal opening h5 might not be completely filled with the gate insulating layer 335. Therefore, as illustrated in FIGS. 52 to 54, the planar insulating layer 310 might not fully occupy the first horizontal opening h5, and a residual first horizontal opening h5' may remain in the first horizontal opening h5. The residual first horizontal opening h5' may be filled with an insulating material using an additional process. Accordingly, the planar insulating layer 310 may be completely formed after filling the residual first horizontal opening h5'.

Figure 55:
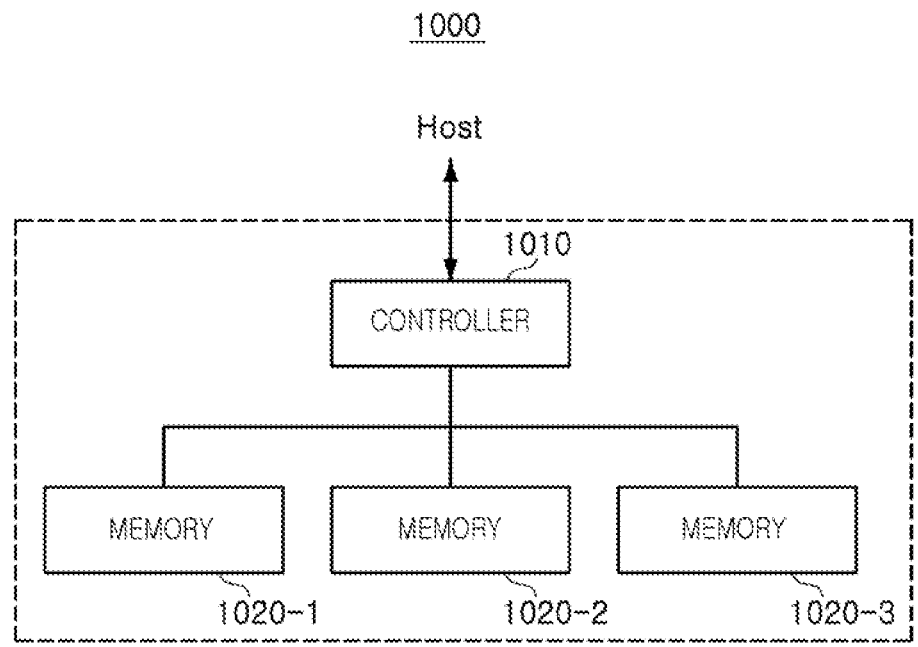
FIGS. 55 to 56 are block diagrams of electronic devices including memory devices according to exemplary embodiments of the inventive concept.
Figure 56:
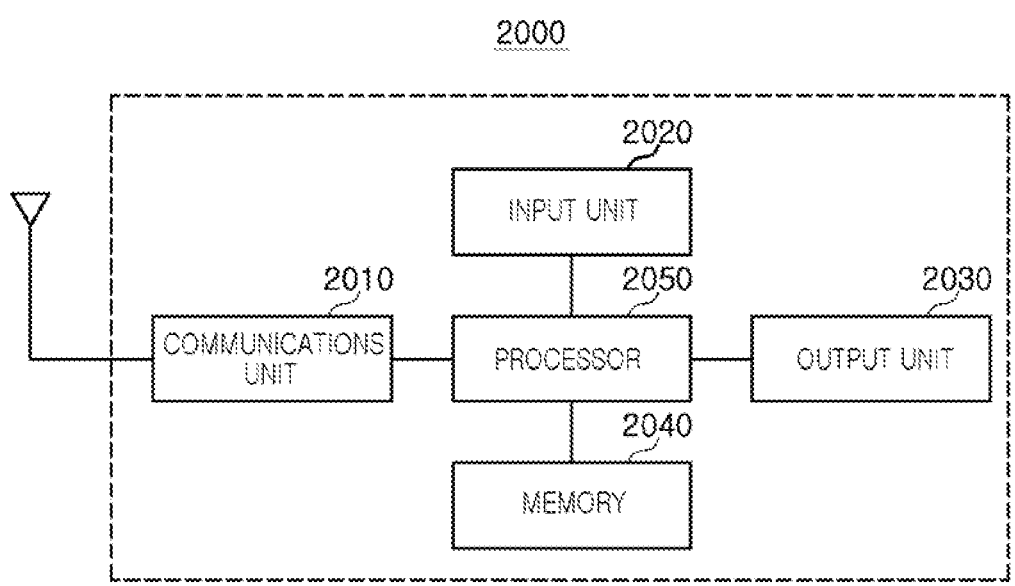

FIGS. 55 and 56 are block diagrams of electronic devices including memories according to exemplary embodiments of the inventive concept.

With reference to FIG. 55, a storage device 1000 may include a controller 1010 communicating with a host, and memories 1020-1, 1020-2, and 1020-3 storing data. The controller 1010 and the memories 1020-1, 1020-2, and 1020-3 may include the semiconductor devices 100, 200, and 300, according to various exemplary embodiments of the inventive concept.

The host communicating with the controller 1010 may be various electronic devices equipped with the storage device 1000. For example, the host may be a smartphone, a digital camera, a desktop computer, a laptop computer, a portable media player, or the like. The controller 1010 may store data in the memories 1020-1, 1020-2, and 1020-3 after receiving requests for data writing or reading sent by the host, or may generate a command (CMD) to output data from the memories 1020-1, 1020-2, and 1020-3.

As illustrated in FIG. 55, one or more memories 1020-1, 1020-2, and 1020-3 may be connected to the controller 1010 in parallel in the storage device 1000. By connecting the plurality of memories 1020-1, 1020-2, and 1020-3 to the controller 1010 in parallel, a storage device 1000 having a large capacity, such as a solid state drive (SSD), may be implemented.

With reference to FIG. 56, an electronic device 2000 may include a communications unit 2010, an input unit 2020, an output unit 2030, a memory 2040, and a processor 2050.

The communications unit 2010 may include a wired/wireless communications module, for example, a wireless Internet module, a near field communications module, a global positioning system (GPS) module, a mobile communications module, and the like. The wired/wireless communications module included in the communications unit 2010 may transmit and receive data by being connected to external communications networks according to various communications standards.

The input unit 2020 may be a module provided for users to control operations of the electronic device 2000 and may include a mechanical switch, a touchscreen, a voice recognition module, and the like. In addition, the input unit 2020 may also include a finger mouse device or a mouse operating using a trackball, a laser pointer, or the like. The input unit 2020 may further include various sensor modules by which users may input data.

The output unit 2030 may output information processed in the electronic device 2000 in a form of audio or video, and the memory 2040 may store a program, data, or the like, to process and control the processor 2050. The memory 2040 may include one or more semiconductor devices 100, 200, and 300, according to various exemplary embodiments of the inventive concept. The processor 2050 may store and output data by sending a command to the memory 2040 according to required operations. The processor 2050 may also include the semiconductor devices 100, 200, and 300.

The memory 2040 may communicate with the processor 2050 through an interface embedded in the electronic device 2000 or a separate interface. When the memory 2040 communicates with the processor 2050 through a separate interface, the processor 2050 may store or output data in or from the memory 2040 through various interface standards, such as a secure digital (SD) interface, a secure digital high capacity (SDHC) interface, a secure digital extended capacity (SDXC) interface, a MICRO SD interface, a USB interface, and the like.

The processor 2050 may control operations of respective units included in the electronic device 2000. The processor 2050 may perform control and process operations relating to voice calls, video calls, data communications, and the like, or may perform control and process operations to play and manage multimedia. In addition, the processor 2050 may process inputs sent by a user through the input unit 2020 and may output the results through the output unit 2030. Furthermore, the processor 2050 may store data required to control operations of the electronic device 2000 in the memory 2040 or output the data therefrom.

As set forth above, a semiconductor device with excellent current characteristics may be provided by disposing a planar insulating layer between a substrate and a channel region to significantly reduce the occurrence of a leakage path and a parasitic capacitance of the semiconductor device.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. A semiconductor device, comprising: a substrate; a planar insulating layer disposed on an upper surface of the substrate; a channel region disposed above the planar insulating layer and included in at in at least one nanosheet; a gate electrode disposed on the channel region; and a source region and a drain region, wherein each of the source region and the drain region is disposed on the substrate and is connected to the at least one nanosheet, wherein the planar insulating layer has a length equal to or greater than a length of the channel region, and wherein the planar insulating layer includes first and second insulating layers having different permittivities, and wherein an upper surface of the planar; insulating layer is in contact with a lower surface of the at least one nanosheet.

2. The semiconductor device of claim 1, further comprising a gate insulating layer disposed between the gate electrode and the channel region, wherein the gate insulating layer and the planar insulating layer are comprised of a same material.

3. The semiconductor device of claim 2, wherein the planar insulating layer has a thickness equal to no more than twice a thickness of the gate insulating layer.

4. The semiconductor device of claim 1, wherein the channel region is included in at least one nanosheet, the at least one nanosheet connecting the source region and the drain region to each other.

5. The semiconductor device of claim 1, further comprising a residual sacrificial layer disposed on at least one of two sides of the planar insulating layer.

6. The semiconductor device of claim 5, wherein the residual sacrificial layer includes a material having a selective etching rate with respect to a material included in the channel region.

7. The semiconductor device of claim 5, wherein the residual sacrificial layer includes undoped semiconductor material.

8. The semiconductor device of claim 7, wherein the residual sacrificial layer includes silicon germanium (SiGe).

9. The semiconductor device of claim 5, wherein a length of the residual sacrificial layer is less than the length of the planar insulating layer.

10. The semiconductor device of claim 5, wherein a length of the residual sacrificial layer is less than a length of each of the source and drain regions.

11. The semiconductor device of claim 5, wherein a thickness of the residual sacrificial layer is substantially equal to a thickness of the planar insulating layer.

12. The semiconductor device of claim 1, wherein the first insulating layer surrounds the second insulating layer.

13. The semiconductor device of claim 12, wherein the planar insulating layer further includes a third insulating layer surrounded by the second insulating layer.

14. The semiconductor device of claim 12, wherein the permittivity of the first insulating layer is lower than the permittivity of the second insulating layer.

15. A semiconductor device, comprising:
a substrate;
a source region and a drain region, each of the source and drain regions being extended in a direction perpendicular to an upper surface of the substrate;
a plurality of nanosheets disposed on the substrate and being separated from the substrate, wherein the plurality of nanosheets is disposed between the source and drain regions, and each of the plurality of nanosheets is parallel with the upper surface of the substrate;
a gate electrode disposed between the source and drain regions to surround the plurality of nanosheets; and
a planar insulating layer disposed between the substrate and the plurality of nanosheets, wherein the planar insulating layer has a length that is greater than a length of each of the plurality of nanosheets, and wherein the planar insulating layer includes a first insulating layer and a second insulating layer, the second insulating layer having a higher permittivity than a permittivity of the first insulating layer,
wherein a thickness of the planar insulating layer is smaller than a distance between adjacent nanosheets among the plurality of nanosheets.

16. A semiconductor device, comprising:
a substrate including a protrusion, wherein the protrusion extends in a first direction and the protrusion is surrounded by a substrate insulating layer;
at least one nanosheet disposed on the substrate, wherein a channel region is formed in the at least one nanosheet;
a planar insulating layer disposed between the protrusion and the at least one nanosheet, wherein a thickness of the planar insulating layer is smaller than a thickness of the substrate insulating layer;
a gate electrode disposed adjacent to the at least one nanosheet; and
a source region and a drain region,
wherein each of the source region and the drain region is disposed on the substrate, and each of the source region and the drain region is connected to the at least one nanosheet,
wherein the planar insulating layer includes first and second insulating layers having different permittivities, and at least a portion of the planar insulating layer is disposed between a source region and the protrusion, and between a drain region and the protrusion.

17. The semiconductor device of claim 16, comprising a first nanosheet, a second nanosheet and a third nanosheet, wherein, in a cross-sectional view, the gate electrode is disposed on only one side of the third nanosheet, on two opposite sides of the second nanosheet, and on two opposite sides of the first nanosheet.

18. The semiconductor device of claim 17, wherein two channel regions are formed in the first nanosheet, two channel regions are formed in the second nanosheet, and one channel region is formed in the third nanosheet.

19. The semiconductor device of claim 16, wherein the planar insulating layer extends in the first direction between two portions of a residual sacrificial layer.

20. The semiconductor device of claim 19, wherein the protrusion overlaps the planar insulating layer and a first portion of the residual sacrificial layer, and either the source region or the drain region overlaps the planar insulating layer and the first portion of the residual sacrificial layer.

* * * * *